(12) United States Patent
Choung et al.

(10) Patent No.: US 8,093,594 B2
(45) Date of Patent: Jan. 10, 2012

(54) DISPLAY SUBSTRATE, DISPLAY DEVICE HAVING THE SAME AND METHOD OF MANUFACTURING THE SAME

(75) Inventors: Jong-Hyun Choung, Suwon-si (KR); Hong-Sick Park, Suwon-si (KR); Joo-Ae Youn, Seongnam-si (KR); Sun-Young Hong, Seoul (KR); Bong-Kyun Kim, Incheon (KR); Won-Suk Shin, Yongin-si (KR); Doo-Hee Jung, Seoul (KR); Byeong-Jin Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 12/487,928

(22) Filed: Jun. 19, 2009

(65) Prior Publication Data

US 2010/0182525 A1   Jul. 22, 2010

Related U.S. Application Data

(62) Division of application No. 11/616,542, filed on Dec. 27, 2006, now Pat. No. 7,563,656.

(30) Foreign Application Priority Data

Jul. 21, 2006   (KR) .................. 10-2006-0068341

(51) Int. Cl.
*H01L 27/14* (2006.01)
(52) U.S. Cl. .................. 257/72; 257/59; 257/40; 349/43
(58) Field of Classification Search .................. 257/40, 257/59, 72; 349/43
See application file for complete search history.

(56) References Cited

U.S. PATENT DOCUMENTS

| 5,847,781 | A | 12/1998 | Ono et al. |
| 6,038,003 | A | 3/2000 | Kim |
| 6,414,730 | B1 | 7/2002 | Akamatsu et al. |
| 2001/0046016 | A1 | 11/2001 | Park et al. |
| 2004/0043545 | A1 | 3/2004 | Yoo et al. |
| 2005/0092984 | A1* | 5/2005 | Yamazaki et al. .............. 257/40 |
| 2006/0046365 | A1 | 3/2006 | Park et al. |
| 2007/0164330 | A1 | 7/2007 | Jeong et al. |

* cited by examiner

*Primary Examiner* — Kenneth Parker
*Assistant Examiner* — Anthony Ho
(74) *Attorney, Agent, or Firm* — H.C. Park & Associates, PLC

(57) ABSTRACT

A display substrate includes an insulating substrate, a thin film transistor, a contact electrode, and a pixel electrode. The thin film transistor includes a control electrode, a semiconductor pattern, a first electrode, and a second electrode. The control electrode is on the insulating substrate. The semiconductor pattern is on the control electrode. The first electrode is on the semiconductor pattern. The second electrode is spaced apart from the first electrode on the semiconductor pattern. The contact electrode includes a contact portion and an undercut portion. The contact portion is electrically connected to the second electrode to partially expose the semiconductor pattern. The undercut portion is electrically connected to the contact portion to cover the semiconductor pattern. The pixel electrode is electrically connected to the second electrode through the contact portion of the contact electrode.

15 Claims, 27 Drawing Sheets

DISPLAY SUBSTRATE, DISPLAY DEVICE HAVING THE SAME AND METHOD OF MANUFACTURING THE SAME

CROSS-REFERENCE TO RELATED APPLICATIONS

This application is a divisional of U.S. patent application Ser. No. 11/616,542, filed on Dec. 27, 2006, and claims priority from and the benefit of Korean Patent Application No. 2006-68341, filed on Jul. 21, 2006, which are both hereby incorporated by reference for all purposes as if fully set forth herein.

BACKGROUND OF THE INVENTION

1. Field of the Invention

The present invention relates to a display substrate, a display device having the display substrate, and a method of manufacturing the display substrate. More particularly, the present invention relates to a display substrate that may have decreased defects.

2. Discussion of the Background

Generally, a display substrate of a display device includes a plurality of conductive lines, a plurality of switching elements, and a plurality of pixel electrodes.

The conductive lines, switching elements, and pixel electrodes may be formed through a plurality of thin film deposition and photolithography processes. Each photolithography process typically includes an exposure process, a development process, a stripping process, an etching process, etc.

Light is irradiated through a photo mask onto a photoresist film in the exposure process. The exposure process may require an expensive exposing device and the photo mask. Thus, manufacturing cost and time may be increased.

Therefore, a display substrate manufacturing method that uses fewer exposure processes has been developed. However, when using fewer exposure processes, the photoresist film may be irregularly developed to change the thickness of the photoresist film and to form an undercut under the photoresist film. Thus, yield of the display substrate may decrease.

SUMMARY OF THE INVENTION

The present invention provides a display substrate that may have decreased defects.

The present invention also provides a display device having the above-mentioned display substrate, thereby providing improved image quality.

The present invention also provides a method of manufacturing the display substrate.

Additional features of the invention will be set forth in the description which follows, and in part will be apparent from the description, or may be learned by practice of the invention.

The present invention discloses a display substrate including an insulating substrate, a thin film transistor, a contact electrode, and a pixel electrode. The thin film transistor is arranged on the insulating substrate and it includes a control electrode, a semiconductor pattern, a first electrode, and a second electrode spaced apart from the first electrode. The contact electrode includes a contact portion and an undercut portion. The contact portion is electrically connected to the second electrode, and it exposes a portion of the semiconductor pattern. The undercut portion is electrically connected to the contact portion, and the undercut portion extends beyond an edge of the semiconductor pattern. The pixel electrode is electrically connected to the contact portion of the contact electrode.

The present invention also discloses a liquid crystal display device including a display substrate, an opposite substrate, and a liquid crystal layer. The display substrate includes an insulating substrate, a thin film transistor, a contact electrode, and a pixel electrode. The thin film transistor includes a control electrode on the insulating substrate, a semiconductor pattern on the control electrode, a first electrode on the semiconductor pattern, and a second electrode on the semiconductor pattern and spaced apart from the first electrode. The contact electrode includes a contact portion electrically connected to the second electrode and exposing a portion of the semiconductor pattern, and an undercut portion electrically connected to the contact portion and extending beyond an edge of the semiconductor pattern. The pixel electrode is electrically connected to the second electrode through the contact portion of the contact electrode. The opposite substrate includes an insulating substrate and a common electrode. The common electrode is arranged on the insulating substrate to correspond to the pixel electrode. The liquid crystal layer is interposed between the display substrate and the opposite substrate.

The present invention also discloses a method of manufacturing a display substrate. The method includes forming a semiconductor pattern, a signal electrode on the semiconductor pattern, and a contact electrode on the semiconductor pattern. The contact electrode includes a contact portion electrically connected to the signal electrode and an undercut portion electrically connected to the contact portion. The contact portion exposes a portion of the semiconductor pattern. A passivation layer is formed on a gate insulating layer arranged on an insulting substrate and on which the semiconductor pattern, the signal electrode and the contact electrode are formed. The gate insulating layer, the passivation layer, and the semiconductor pattern adjacent to the undercut portion are first etched to form an undercut under the undercut portion. The first etched passivation layer is second etched so that the portion of the semiconductor pattern that protrudes from under the contact portion is exposed. A pixel electrode electrically connected to the contact portion is formed along the exposed portion of the semiconductor pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
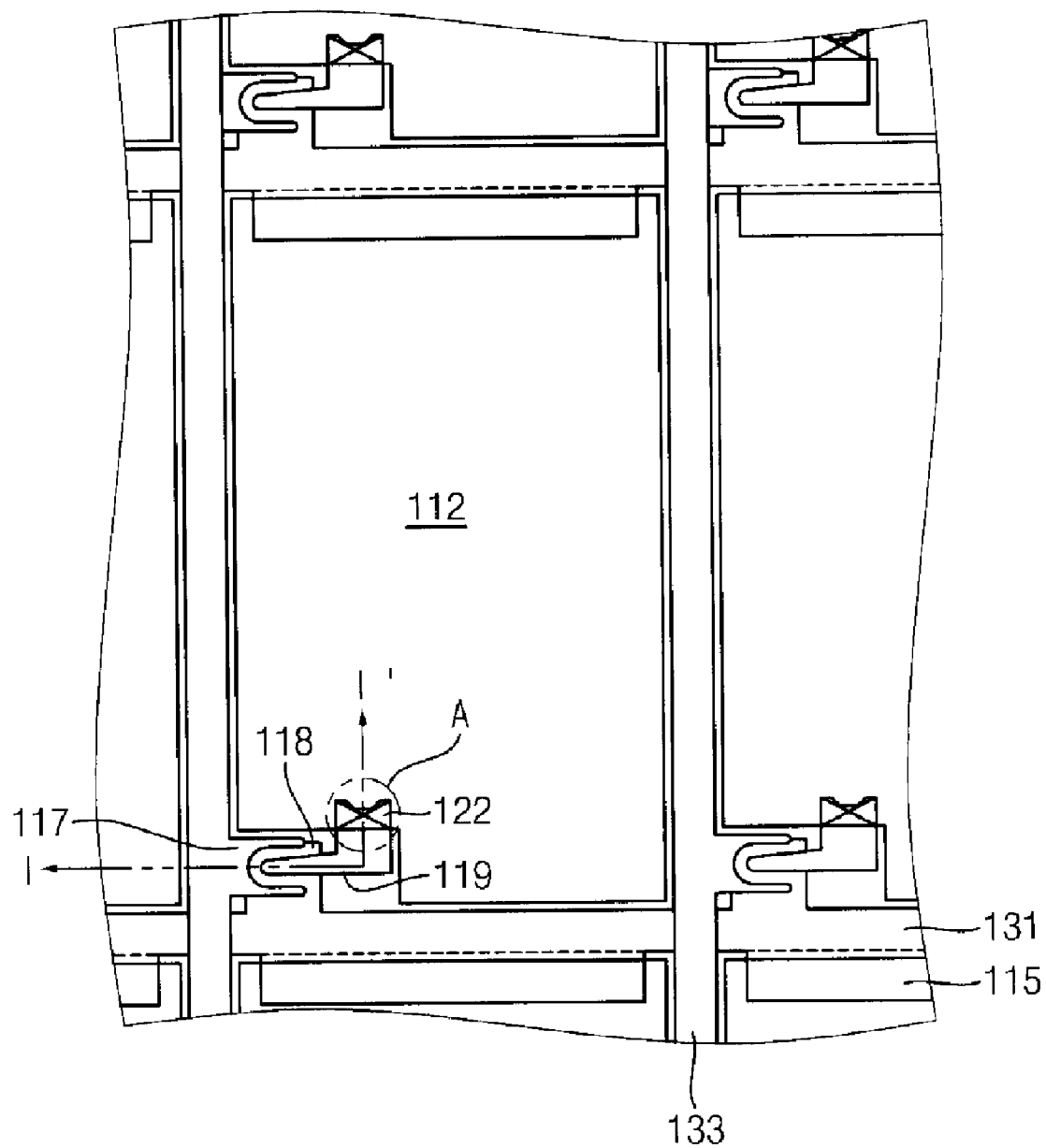
FIG. 1 is a plan view showing a display substrate in accordance with an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result of, for example, manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 2:
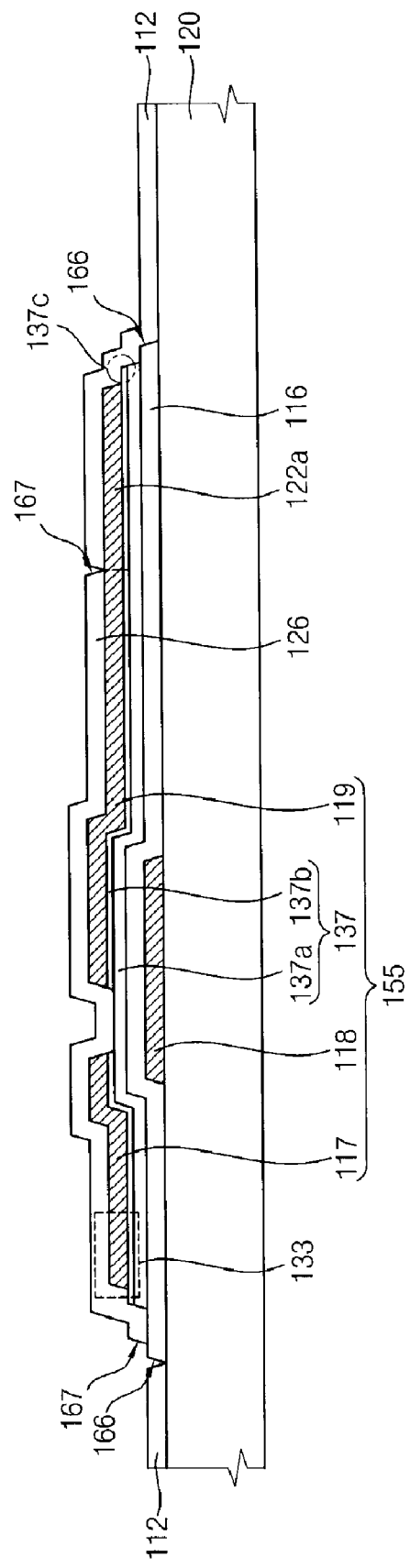
FIG. 2 is a cross-sectional view taken along line I-I' of FIG. 1.

FIG. 1 is a plan view showing a display substrate in accordance with an exemplary embodiment of the present invention. FIG. 2 is a cross-sectional view taken along line I-I' of FIG. 1.

Referring to FIG. 1 and FIG. 2, the display substrate includes an insulating substrate 120, a gate line 131, a gate insulating layer 116, a semiconductor pattern 137, a data line 133, a passivation layer 126, a thin film transistor 155, a contact electrode 122, a storage electrode 115, and a pixel electrode 112.

The insulating substrate 120 may be substantially transparent, and it may include glass, quartz, etc. Light may pass through the insulating substrate 120. The insulating substrate 120 should not include alkaline ions. If the insulating substrate 120 includes alkaline ions, the ions may dissolve in a liquid crystal layer (not shown) and decrease the layer's resistivity, thereby decreasing image display quality and adhesive strength between a sealant (not shown) and the insulating substrate 120. Additionally, characteristics of the thin film transistor 155 may deteriorate.

Alternatively, the insulating substrate 120 may also include an optically transparent polymer. Examples of the optically transparent polymer include triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cycloolefin polymer (COP), etc. These can be used alone or in combination.

The insulating substrate 120 may be optically isotropic. Alternatively, it may be optically anisotropic.

The gate line 131 is on the insulating substrate 120.

The storage electrode 115 is on the insulating substrate 120, and it protrudes from the gate line 131. The storage electrode 115 partially overlaps with the pixel electrode 112 to form a storage capacitor. Alternatively, a storage electrode line may be arranged substantially parallel with the gate line 131.

The gate insulating layer 116 covers the gate line 131 and a gate electrode 118 of the thin film transistor 155. For example, the gate insulating layer 116 may have a plurality of first openings 166 arranged in a matrix. In FIG. 1 and FIG. 2, an image signal may be applied to the pixel electrode 112 through each opening 166.

The semiconductor pattern 137 is on the gate insulating layer 116 at locations corresponding to the data line 133, the thin film transistor 155, and the contact electrode 122.

The semiconductor pattern 137 includes an amorphous silicon pattern 137a and an n+ amorphous silicon pattern 137b. The amorphous silicon pattern 137a is on the gate insulating layer 116, and the n+ amorphous silicon pattern 137b is on the amorphous silicon pattern 137a.

The data line 133 is on the gate insulating layer 116 having the semiconductor pattern 137, and it crosses the gate line 131.

The thin film transistor 155 is on the insulating substrate 120, and it includes the gate electrode 118, the semiconductor pattern 137, a source electrode 117, and a drain electrode 119. Applying a voltage difference between the gate electrode 118 and the source electrode 117 may form a channel in the semiconductor pattern 137 that electrically connects the source electrode 117 and the drain electrode 119, so that a data signal may be applied to the pixel electrode 112 through the channel.

The gate electrode 118 is on the insulating substrate 120, and it is electrically connected to the gate line 131. As FIG. 1 shows, the gate electrode 118 may protrude from the gate line 131.

The source electrode 117 is on the semiconductor pattern 137, and it is electrically connected to the data line 133. As FIG. 1 shows, the source electrode 117 may protrude from the data line 133.

The drain electrode 119 is on the semiconductor pattern 137, and it is spaced apart from the source electrode 117. A portion of the n+ amorphous silicon pattern 137b between the source electrode 117 and the drain electrode 119 is etched to expose the underlying amorphous silicon pattern 137a.

Figure 3:
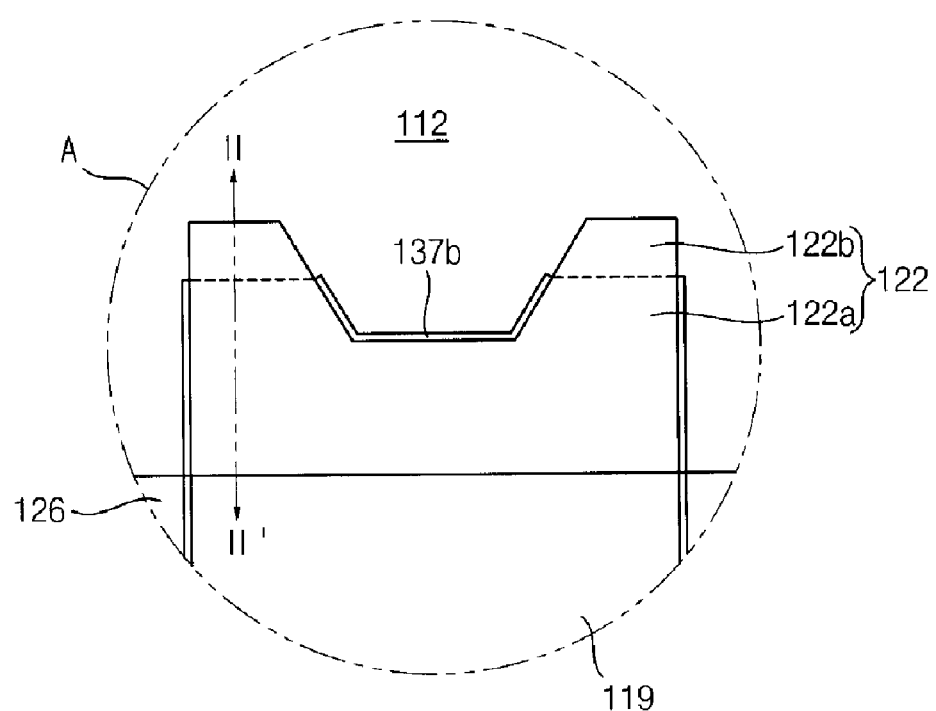
FIG. 3 is an enlarged plan view showing a portion 'A' of FIG. 1.
Figure 4:
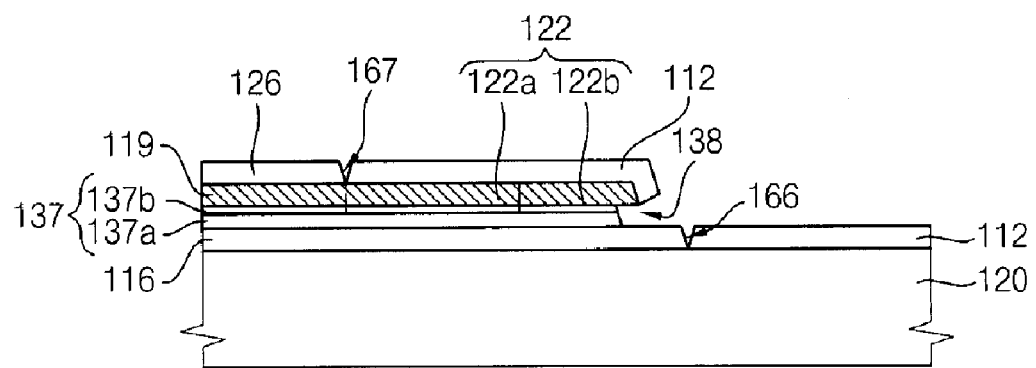
FIG. 4 is a cross-sectional view taken along line II-II' of FIG. 3.

FIG. 3 is an enlarged plan view showing a portion 'A' of FIG. 1. FIG. 4 is a cross-sectional view taken along line II-II' of FIG. 3.

Referring to FIG. 1, FIG. 2, FIG. 3, and FIG. 4, the contact electrode 122 is on the semiconductor pattern 137, and it is electrically connected to the drain electrode 119. The contact electrode 122 includes a contact portion 122a and an undercut portion 122b. For example, the contact electrode 122 is formed from substantially the same layer as the drain electrode 119, and it is integrally formed with the drain electrode 119.

The contact portion 122a is electrically connected to the drain electrode 119. In FIG. 2, the contact portion 122a partially exposes the n+ amorphous silicon pattern 137b of the semiconductor pattern 137 along protrusion 137c.

The undercut portion 122b is electrically connected to the contact portion 122a. In FIG. 4, the undercut portion 122b extends beyond the semiconductor pattern 137. Thus, an undercut 138 is formed under the undercut portion 122b.

In FIG. 3, the undercut portion 122b protrudes from opposite corners of the contact portion 122a to substantially form a U-shape in the contact electrode 122.

The passivation layer 126 covers the semiconductor pattern 137, the data line 133, the source electrode 117, and the drain electrode 119. The passivation layer 126 includes a plurality of second openings 167. The contact electrode 122 and the pixel electrode 112 are partially exposed through the second openings 167. For example, each second opening 167 may be greater than each first opening 166, and each first opening 166 may be in each second opening 167.

The pixel electrode 112 is formed in each second opening 167 of the passivation layer 126. The pixel electrode 112 covers the gate insulating layer 116, the semiconductor pattern 137, and the contact electrode 122. The pixel electrode 112 includes a transparent conductive material. Examples of the transparent conductive material include indium tin oxide (ITO), indium zinc oxide (IZO), indium tin zinc oxide (ITZO), amorphous indium tin oxide (a-ITO), etc.

In FIG. 2, the contact portion 122a partially exposes the semiconductor pattern 137, and a portion of the pixel electrode 112 on the contact portion 122a extends onto the insulating substrate 120 along the exposed semiconductor pattern 137. For example, the portion of the pixel electrode 112 extends onto the insulating substrate 120 along the protrusion 137c of the semiconductor pattern 137.

In FIG. 4, the undercut portion 122b protrudes toward each first opening 166 to form the undercut 138. A portion of the pixel electrode 112 on the undercut portion 122b is spaced apart from a portion of the pixel electrode 112 in the first opening 166 due to a crack that is formed in the pixel electrode 112 at the undercut 138.

According to the display substrate of FIG. 1, FIG. 2, FIG. 3, and FIG. 4, the contact electrode 122 substantially has a U-shape so that the drain electrode 119 is electrically connected to the pixel electrode 112 in each first opening 166 through the contact portion 122a of the contact electrode 122.

Figure 5:
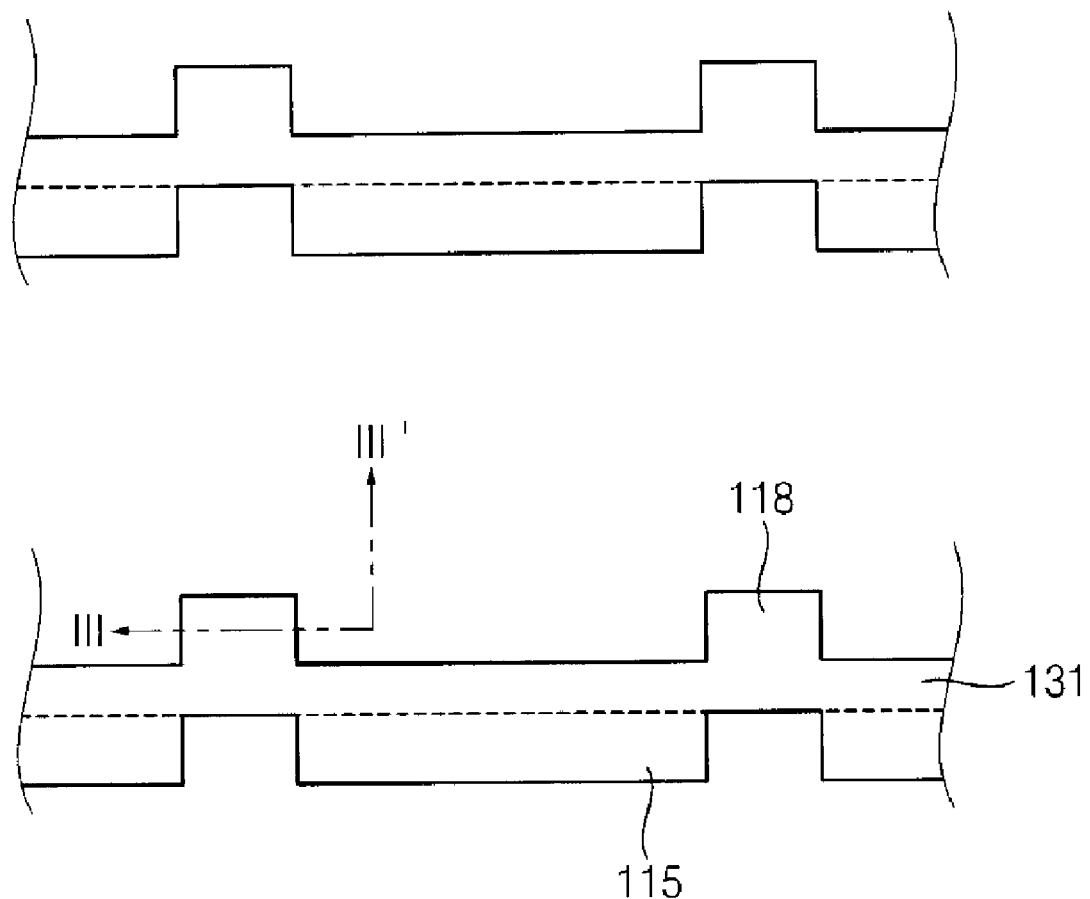
FIG. 5, FIG. 10, and FIG. 13 are plan views showing a method of manufacturing the display substrate of FIG. 1 according to an exemplary embodiment of the present invention.
Figure 9:
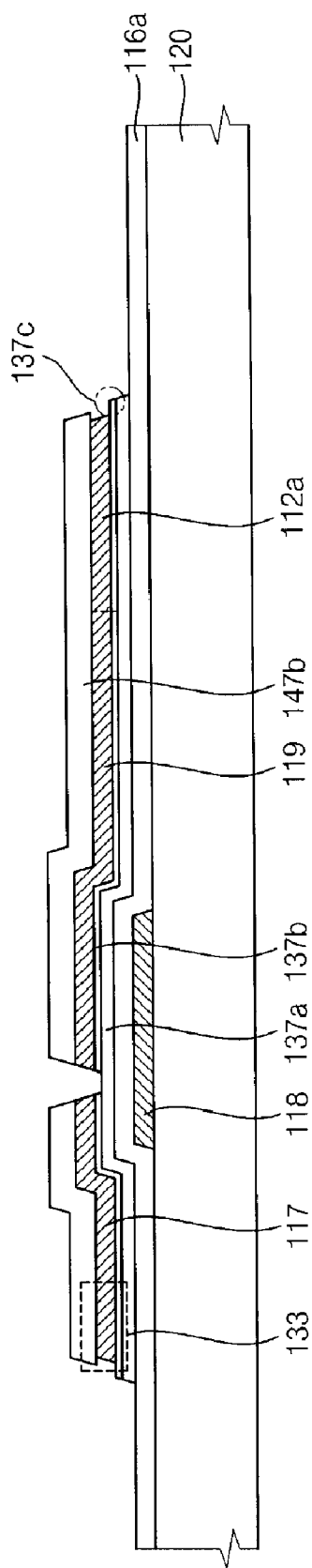
Figure 10:
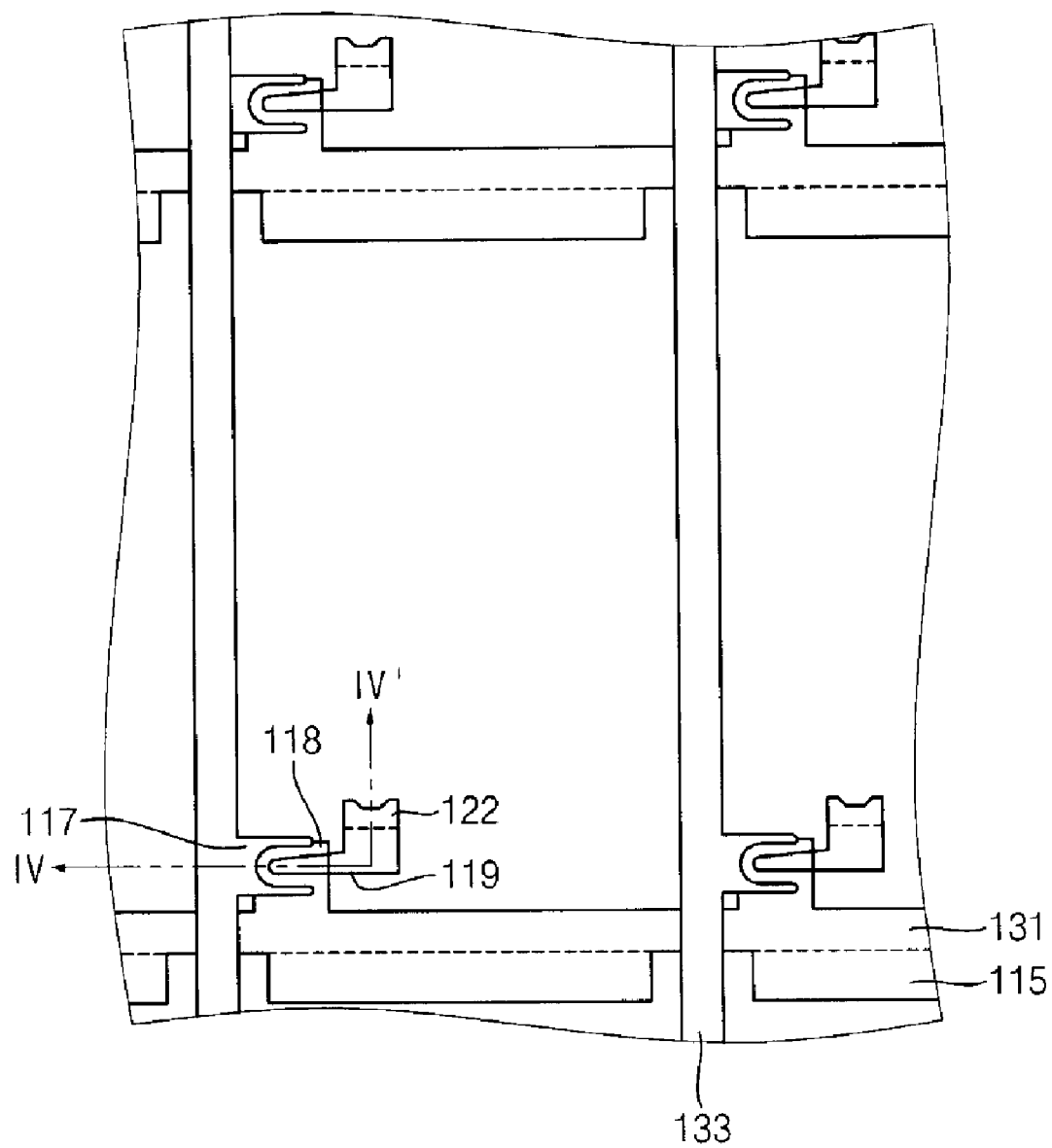
Figure 12:
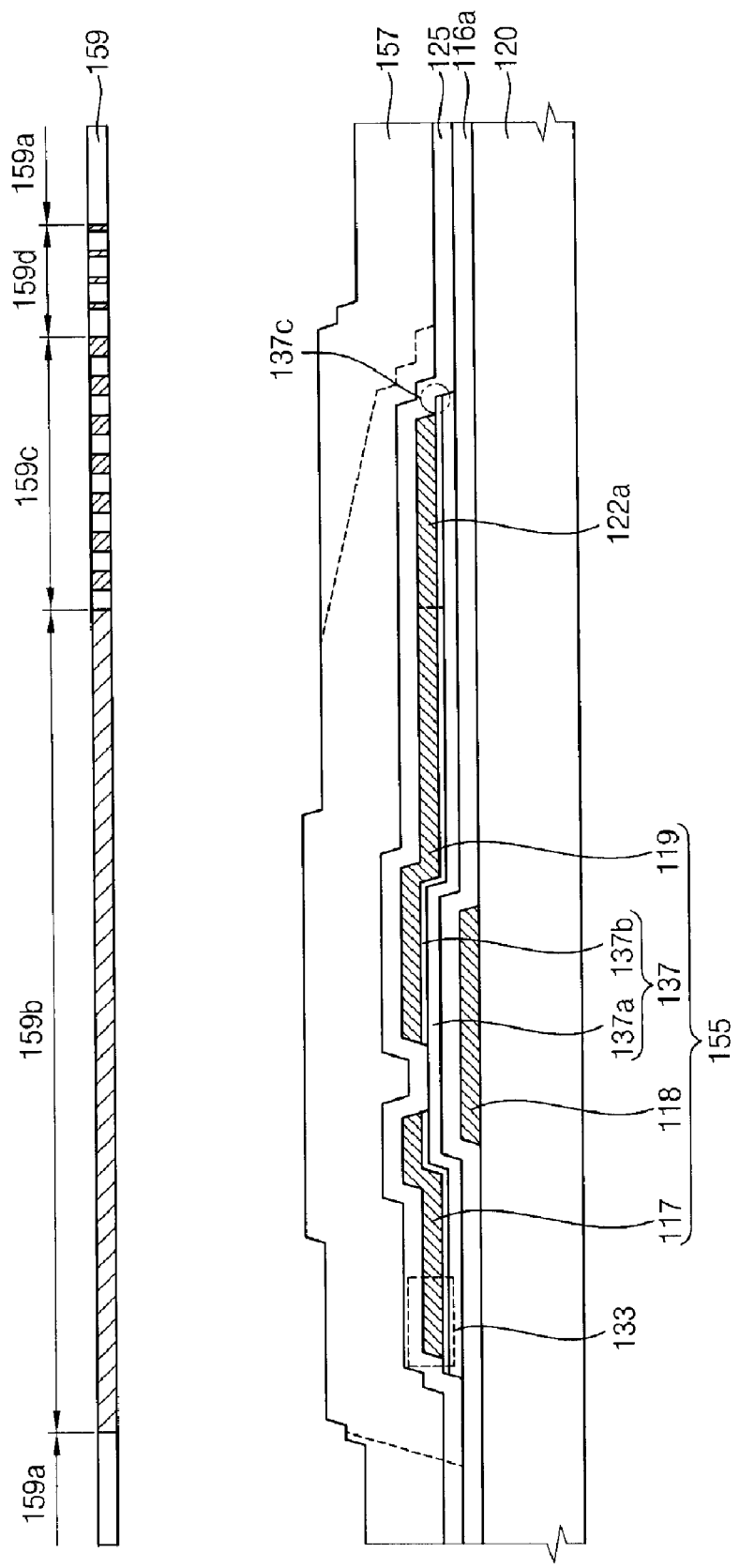
Figure 13:
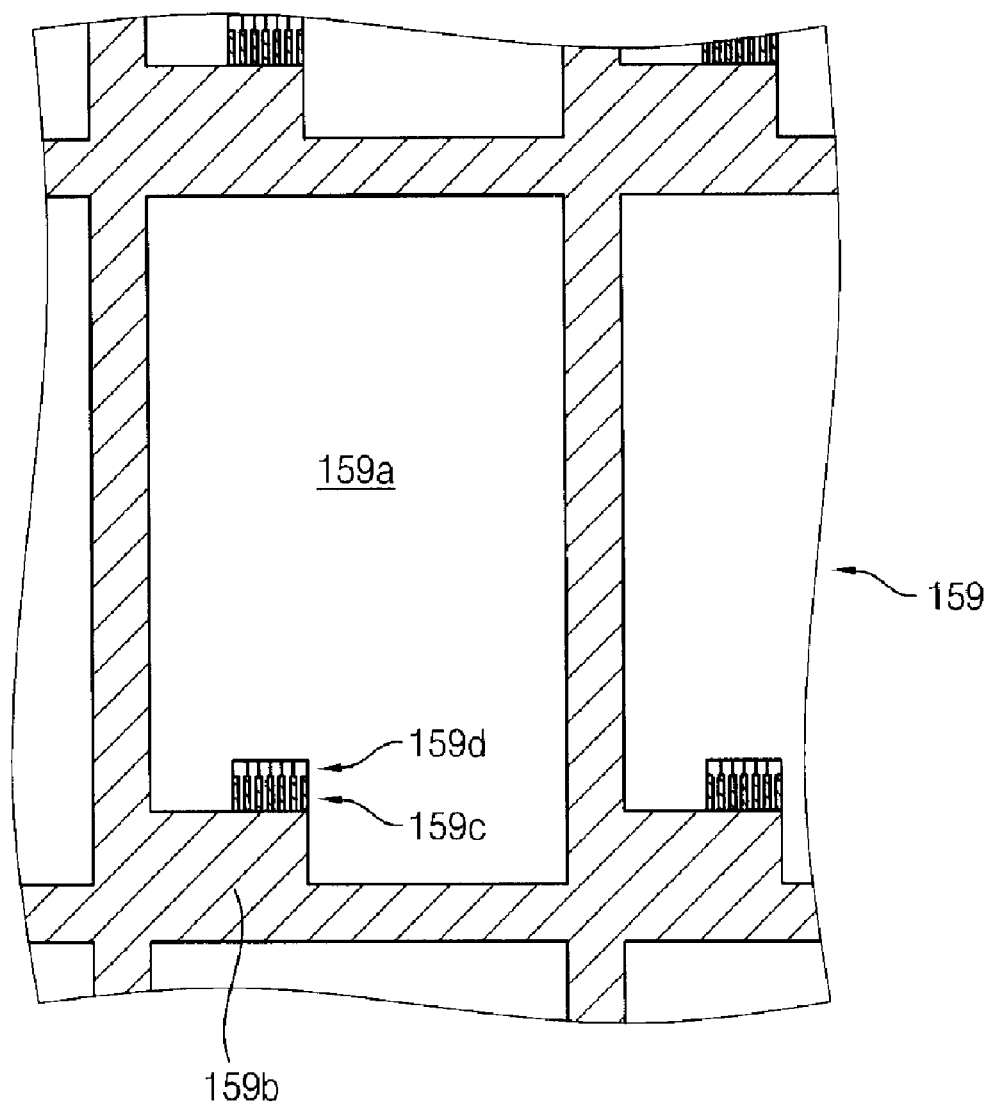

FIG. 5, FIG. 10, and FIG. 13 are plan views showing a method of manufacturing the display substrate of FIG. 1 according to an exemplary embodiment of the present invention. FIG. 6, FIG. 7, FIG. 8, FIG. 9, FIG. 11, FIG. 12, FIG. 14, FIG. 15, FIG. 16, FIG. 17, FIG. 18, FIG. 19, FIG. 20, FIG. 21, and FIG. 22 are cross-sectional views showing the method of manufacturing the display substrate of FIG. 1.

Figure 6:
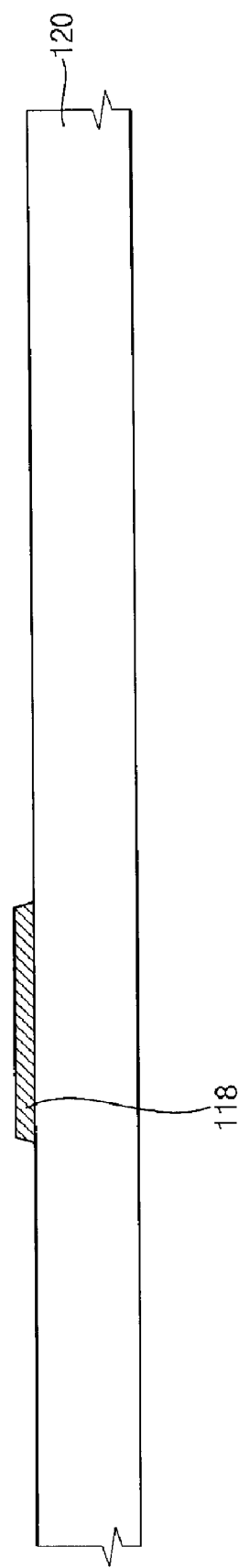
FIG. 6, FIG. 7, FIG. 8, FIG. 9, FIG. 11, FIG. 12, FIG. 14, FIG. 15, FIG. 16, FIG. 17, FIG. 18, FIG. 19, FIG. 20, FIG. 21, and FIG. 22 are cross-sectional views showing a method of manufacturing the display substrate of FIG. 1.

FIG. 5 is a plan view showing a method for forming the gate line, the gate electrode, and the storage electrode of the display substrate of FIG. 1. FIG. 6 is a cross-sectional view taken along line III-III' of FIG. 5.

Referring to FIG. 1, FIG. 5, and FIG. 6, a gate metal layer (not shown) is deposited on the insulating substrate 120. The gate metal layer is partially etched through a photolithography process to form the gate line 131, the gate electrode 118, and the storage electrode 115.

Figure 7:
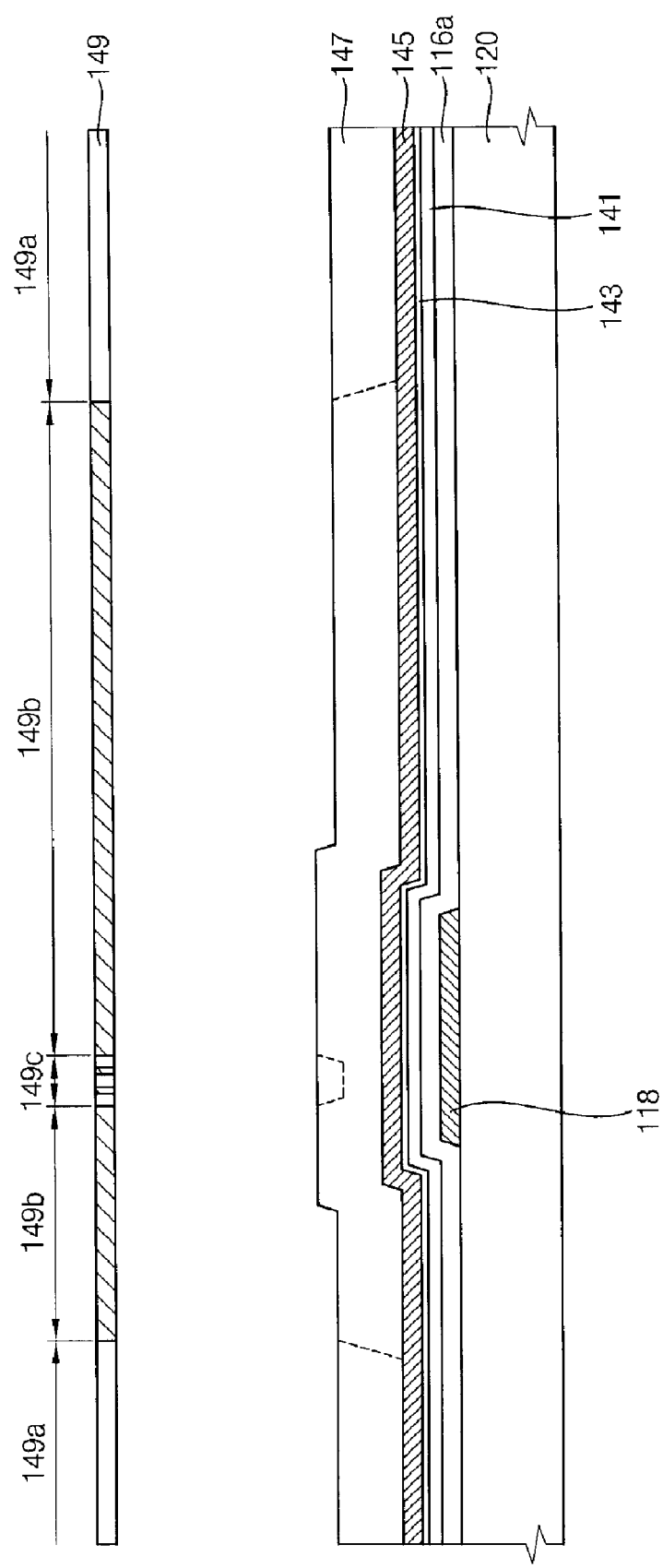

Referring to FIG. 1 and FIG. 7, a primary gate insulating layer 116a, an amorphous silicon layer 141, an n+ amorphous silicon layer 143, and a data metal layer 145 are sequentially formed on the insulating substrate 120. The amorphous silicon layer 141 and the n+ amorphous silicon layer 143 may be formed by, for example, implanting n+ impurities into an upper portion of a primary amorphous silicon layer (not shown). A first photoresist film 147 is formed on the data metal layer 145.

A first mask 149 is aligned on the first photoresist film 147. The first mask 149 includes a transparent portion 149a, an opaque portion 149b, and a slit portion 149c.

The opaque portion 149b corresponds to the data line 133, the source electrode 117, the drain electrode 119, and the contact electrode 122. The slit portion 149c corresponds to a channel region between the source electrode 117 and the drain electrode 119. The slit portion 149c may include a half tone pattern, and it is arranged within the opaque portion 149b. The transparent portion 149a is interposed between opaque portions 149b.

The first photoresist film 147 is exposed through the first mask 149.

Figure 8:
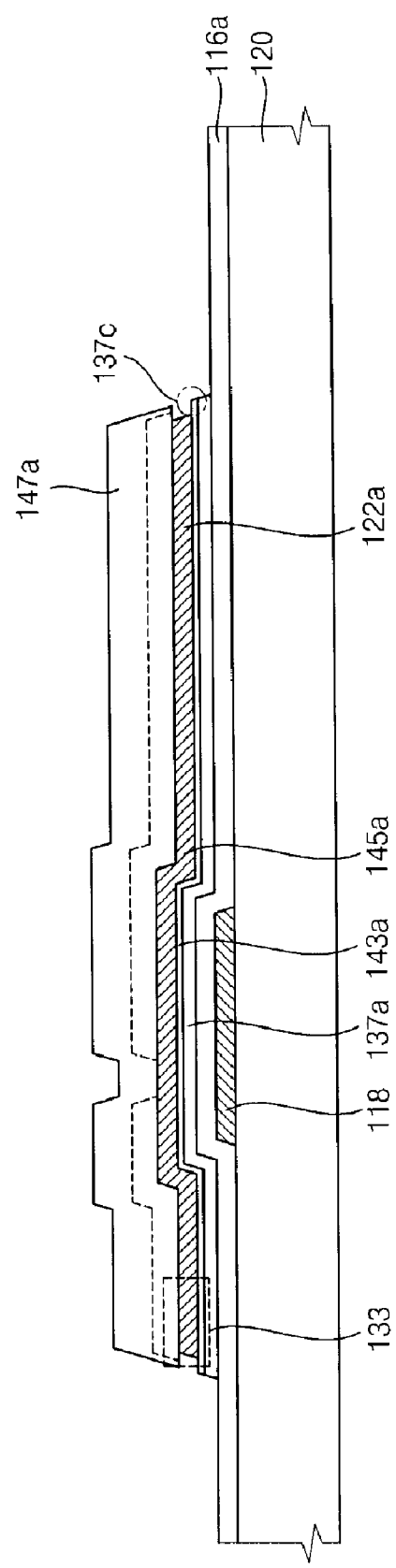

Referring to FIG. 1 and FIG. 8, the exposed first photoresist film 147 is developed to form a first photoresist pattern 147a.

The data metal layer 145, the n+ amorphous silicon layer 143, and the amorphous silicon layer 141 are partially etched using the first photoresist pattern 147a as an etching mask to form the data line 133, a source/drain metal pattern 145a, the contact portion 122a, the undercut portion 122b (shown in FIG. 3), a primary n+ amorphous silicon pattern 143a and the amorphous silicon pattern 137a. For example, an etching rate of the data metal layer 145 may be greater than that of the n+ amorphous silicon layer 143 and the amorphous silicon layer 141 so that the contact portion 122a and the undercut portion 122b are recessed with respect to the primary n+ amorphous silicon pattern 143a. Thus, the primary n+ amorphous silicon pattern 143a and the amorphous silicon pattern 137a that are under the contact portion 122a protrude with respect to the contact portion 122a to form the protrusion 137c, and the primary n+ amorphous silicon pattern 143a and the amorphous silicon pattern 137a that are under the undercut portion 122b also protrude with respect to the undercut portion 122b.

Referring to FIG. 1 and FIG. 9, a thickness of the first photoresist pattern 147a is decreased through an ashing process to form photoresist patterns 147b partially exposing the source/drain metal pattern 145a in the channel region between the source electrode 117 and the drain electrode 119. For example, the ashing process may include oxygen plasma. Alternatively, the thickness of first photoresist pattern 147a may be decreased through an etch-back process.

The source/drain metal pattern 145a is etched in the channel region to form the source electrode 117 and the drain electrode 119.

The primary n+ amorphous silicon pattern 143a is also etched in the channel region to form the n+ amorphous silicon pattern 137b. For example, the primary n+ amorphous silicon pattern 143a may be etched in the channel region using substantially the same etchant for etching the source/drain metal pattern 145a.

Figure 11:
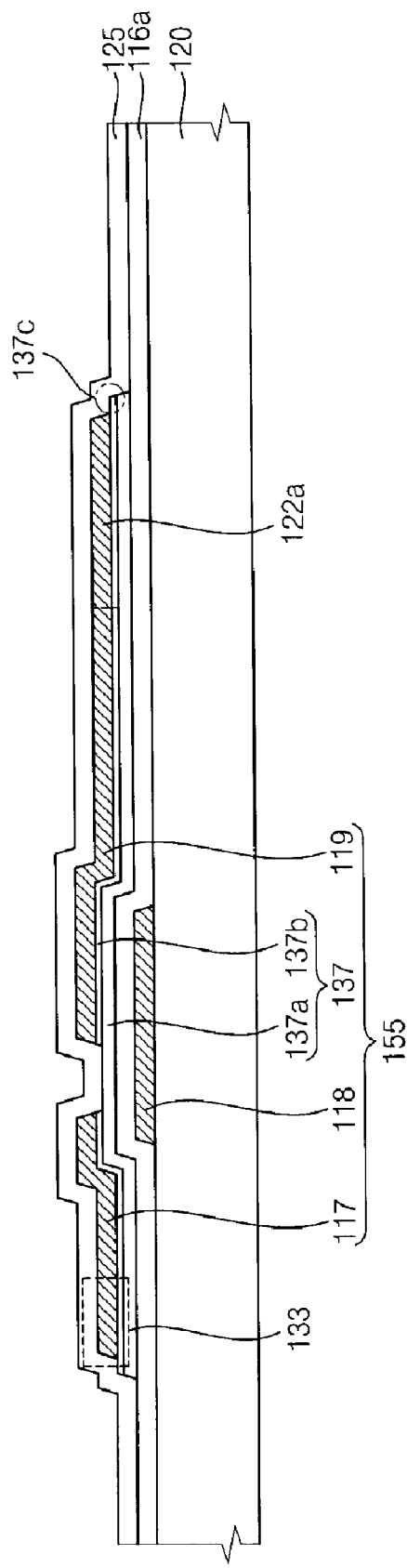

FIG. 10 is a plan view showing a method for forming a protecting layer on the substrate shown in FIG. 9. FIG. 11 is a cross-sectional view taken along line IV-IV' of FIG. 10.

Referring to FIG. 1, FIG. 3, FIG. 10, and FIG. 11, the photoresist patterns 147b that remain on the data line 133, the source electrode 117, the drain electrode 119, the contact portion 122a, and the undercut portion 122b are removed.

The protecting layer 125 is formed on the primary gate insulating layer 116a to cover the semiconductor pattern 137, the data line 133, the thin film transistor 155, the contact portion 122a, and the undercut portion 122b.

Referring to FIG. 12, a second photoresist film 157 is formed on the protecting layer 125.

FIG. 13 is a plan view showing a second mask for exposing the second photoresist film 157 of FIG. 12.

Referring to FIG. 12 and FIG. 13, a second mask 159 is aligned on the second photoresist film 157. The second mask 159 includes a transparent portion 159a, an opaque portion 159b, a first translucent portion 159c, and a second translucent portion 159d. For example, the first translucent portion 159c includes a plurality of first slits, and the second translucent portion 159d includes a plurality of second slits. Each second slit is wider than each first slit. An interface between the first translucent portion 159c and the second translucent portion 159d crosses an outer surface of the contact electrode 122.

The opaque portion 159b corresponds to the gate line 131, the data line 133, and the thin film transistor 155.

The first and second translucent portions 159c and 159d correspond to the contact electrode 122 and a portion of the pixel electrode 112 adjacent to the contact electrode 122. The first translucent portion 159c covers the contact portion 122a and a portion of the primary gate insulating layer 116a adjacent to the contact portion 122a. The second translucent portion 159d is interposed between the first translucent portion 159c and the transparent portion 159a.

The transparent portion 159a and the second translucent portion 159d correspond to the pixel electrode 112.

The second photoresist film 157 is exposed through the second mask 159.

Figure 14:
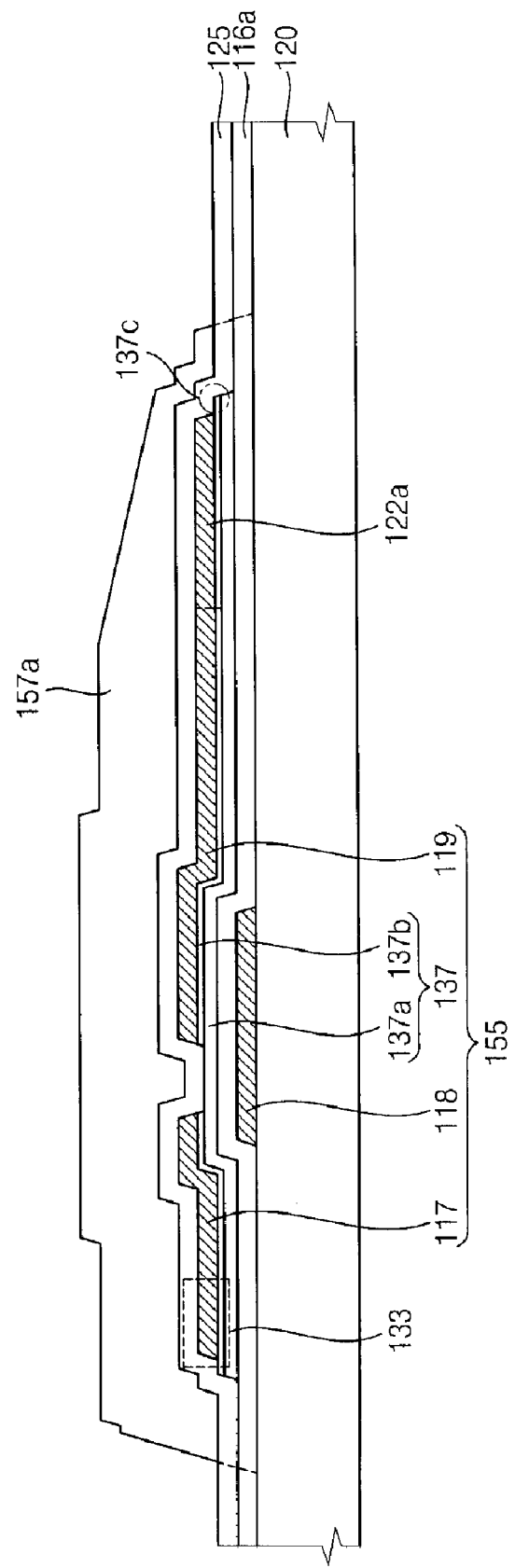

Referring to FIG. 14, the exposed second photoresist film 157 is developed to form a second photoresist pattern 157a.

Figure 15:
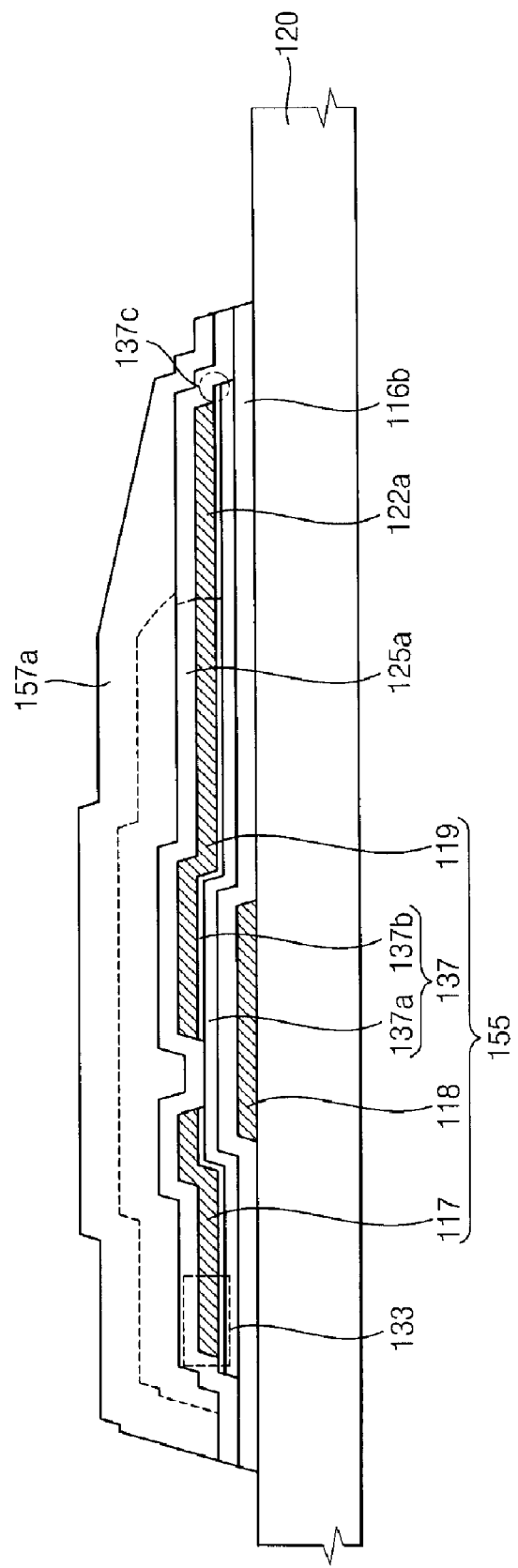
Figure 16:
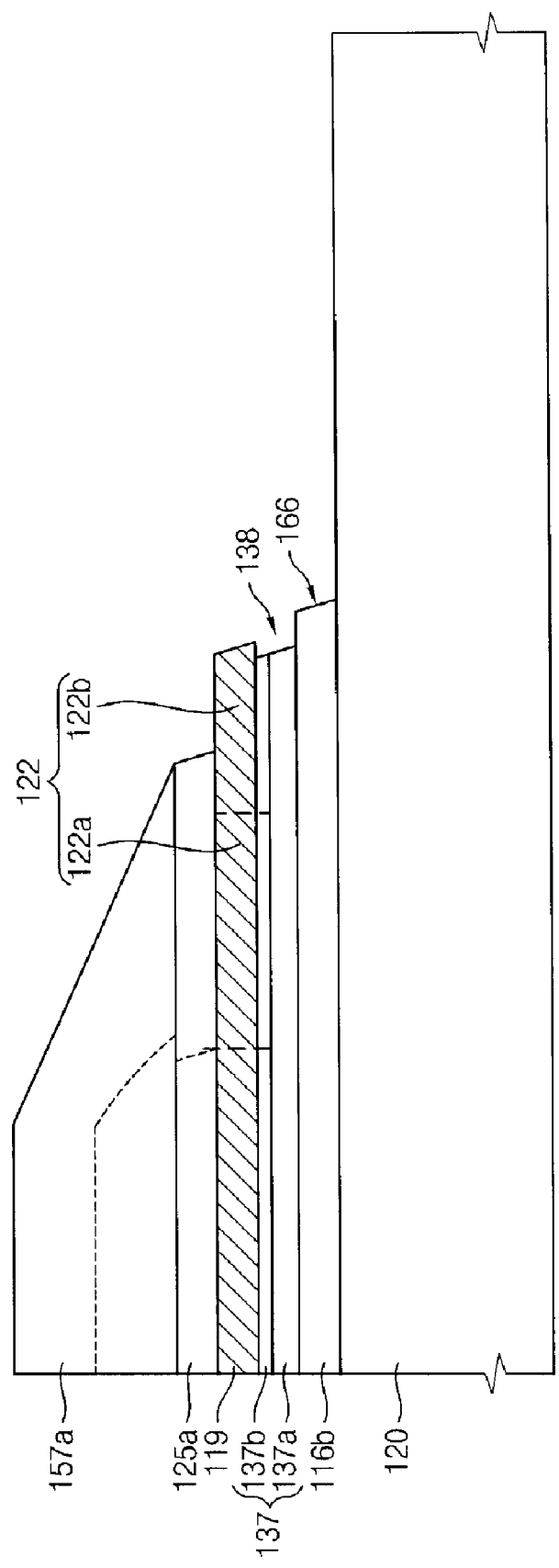

FIG. 15 and FIG. 16 are cross-sectional views showing a method of first etching the primary gate insulating layer and the protecting layer of FIG. 14. FIG. 15 corresponds to line I-I' of FIG. 1. FIG. 16 corresponds to line II-II' of FIG. 3.

Referring to FIG. 15 and FIG. 16, the primary gate insulating layer 116a and the protecting layer 125 are partially first etched using the second photoresist pattern 157a as an etching mask to form a primary gate insulating pattern 116b and a protecting pattern 125a.

In FIG. 15, the second photoresist pattern 157a covers the contact portion 122a and the protrusion 137c of the semiconductor pattern 137 that extends beyond the contact portion 122a. Thus, the second photoresist pattern 157a prevents the protrusion 137c from being etched during the first etching process. For example, the second photoresist pattern 157a on the contact portion 122a may be more than about 11,000 Å thick.

Referring to FIG. 16, the second photoresist pattern 157a exposes the protecting layer 125 on the undercut portion 122b. The protecting layer 125 covers the undercut portion 122b and the semiconductor pattern 137 under the undercut portion 122b. A second photoresist pattern 157a being no more than about 2,500 Å thick may remain on the undercut portion 122b. The semiconductor pattern 137 is exposed under the undercut portion 122b during the first etching process, and an end portion of the semiconductor pattern 137 under the undercut portion 122b is partially etched to form the undercut 138.

Figure 17:
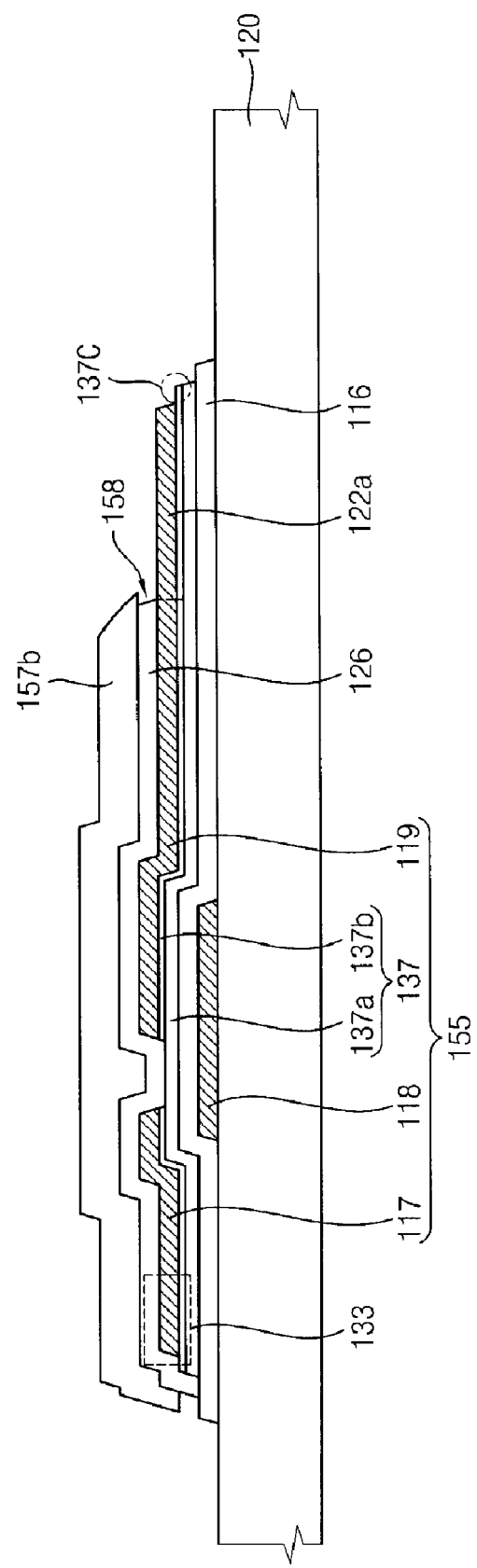
Figure 18:
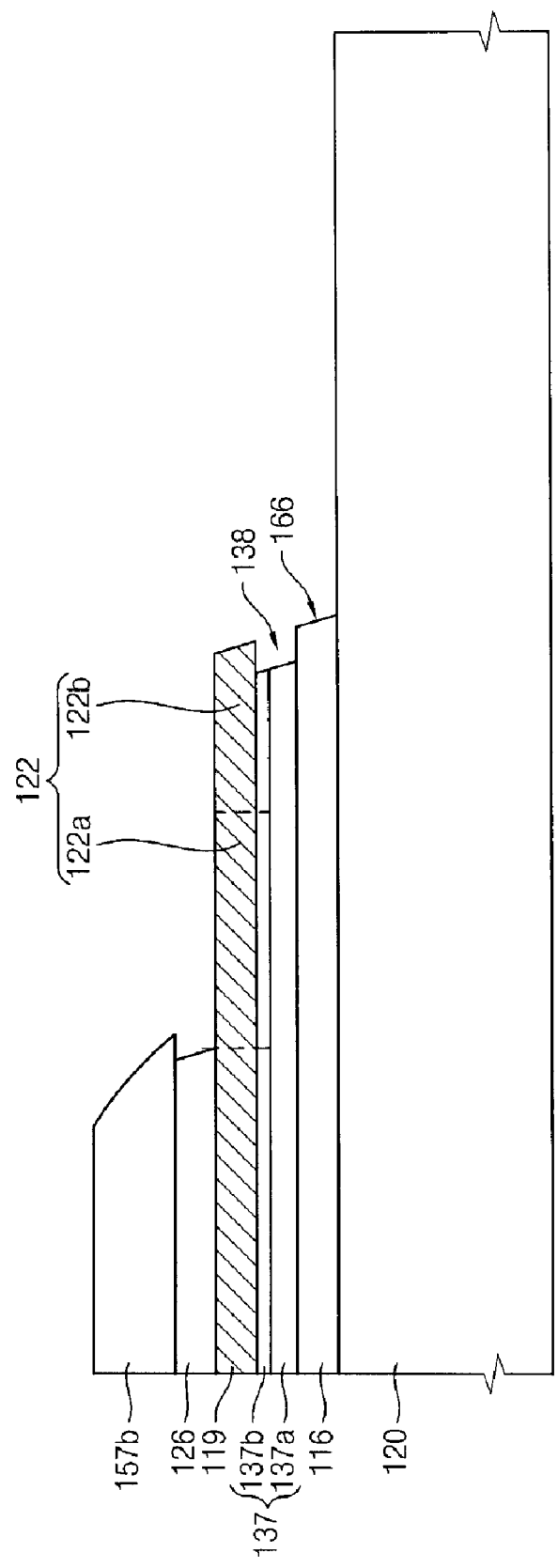

FIG. 17 is a cross-sectional view showing a method of ashing and second etching the second photoresist pattern 157a of FIG. 15. FIG. 18 is a cross-sectional view showing a method of ashing and second etching the second photoresist pattern 157a of FIG. 16. FIG. 17 corresponds to line I-I' of FIG. 1. FIG. 18 corresponds to line II-II' of FIG. 3.

Referring to FIG. 17 and FIG. 18, thinning the second photoresist pattern 157a through an ashing process forms a stripping photoresist pattern 157b partially exposing the protecting pattern 125a. The exposed protecting pattern 125a is second etched to form the passivation layer 126. For example, the second etching process may be an isotropic etching process, and an undercut 158 may be formed on the protecting pattern 125a that is under the stripping photoresist pattern 157b.

Referring again to FIG. 15 and FIG. 17, the second photoresist pattern 157a on the contact portion 122a is thinned through the ashing process to expose the protecting pattern 125a on the contact portion 122a. Thus, the exposed protecting pattern 125a on the contact portion 122a is removed through the second etching process to expose the contact portion 122a and the protrusion 137c.

Referring again to FIG. 16 and FIG. 18, the protecting pattern 125a is exposed on the undercut portion 122b through the ashing process. Thus, the exposed protecting pattern 125a on the undercut portion 122b is removed through the second etching process to expose the undercut portion 122b.

For example, the semiconductor pattern 137 under the contact portion 122a is protected from the first etching process to form the protrusion 137c. However, the semiconductor pattern 137 under the undercut portion 122b is partially removed through the first etching process to form the undercut 138.

Figure 19:
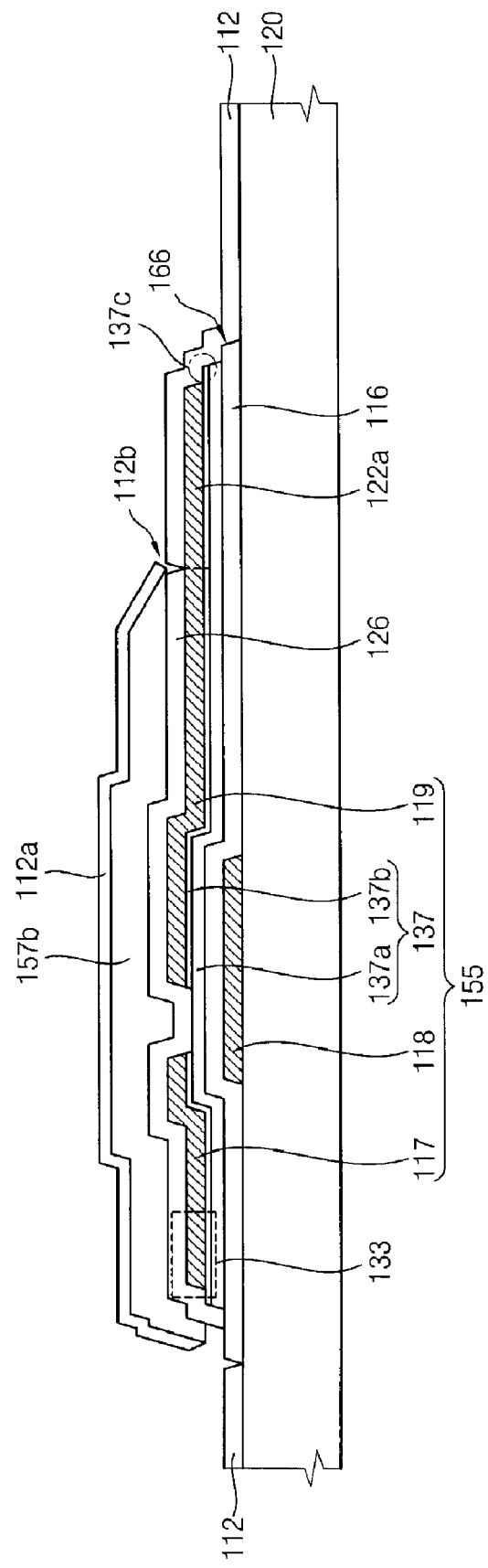
Figure 20:
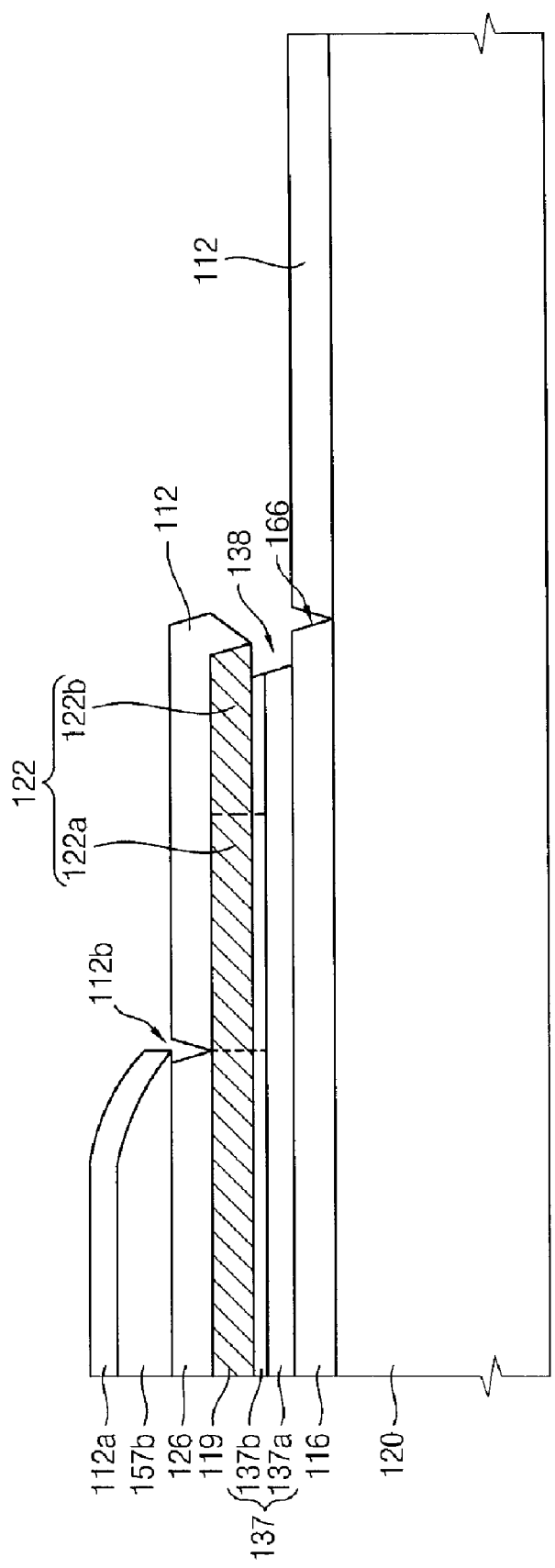

FIG. 19 is a cross-sectional view showing a method of forming a transparent conductive layer on the substrate of FIG. 17. FIG. 20 is a cross-sectional view showing a method of forming the transparent conductive layer on the substrate of FIG. 18. FIG. 19 corresponds to line I-I' of FIG. 1. FIG. 20 corresponds to line II-II' of FIG. 3.

Referring to FIG. 19 and FIG. 20, the transparent conductive layer is deposited on the insulating substrate 120 having the exposed contact portion 122a and undercut portion 122b. The transparent conductive layer includes the pixel electrode 112 and a stripping pattern 112a. The stripping pattern 112a is on the stripping photoresist 157b.

Referring again to FIG. 19, a crack 112b is formed between the stripping pattern 112a and a first portion of the pixel electrode 112, which is on the contact portion 122a, so that the stripping photoresist pattern 157b is partially exposed through the crack 112b. The pixel electrode 112 extends from the contact portion 122a toward the insulating substrate 120 so that the first portion of the pixel electrode 112 on the contact portion 122a is electrically connected to a third portion of the pixel electrode 112 on the insulating substrate 120.

Referring again to FIG. 20, the crack 112b is also formed between the stripping pattern 112a and the first portion of the pixel electrode 112 on the contact portion 122a so that the stripping photoresist pattern 157b is partially exposed through the crack 112b. However, a second crack is also formed between a second portion of the pixel electrode 112, which is on the undercut portion 122b, and the third portion of the pixel electrode 112 on the insulating substrate 120. The second crack partially exposes the undercut 138 between the second portion of the pixel electrode 112, which is on the undercut portion 122b, and the third portion of the pixel electrode 112, which is on the insulating substrate 120.

Figure 21:
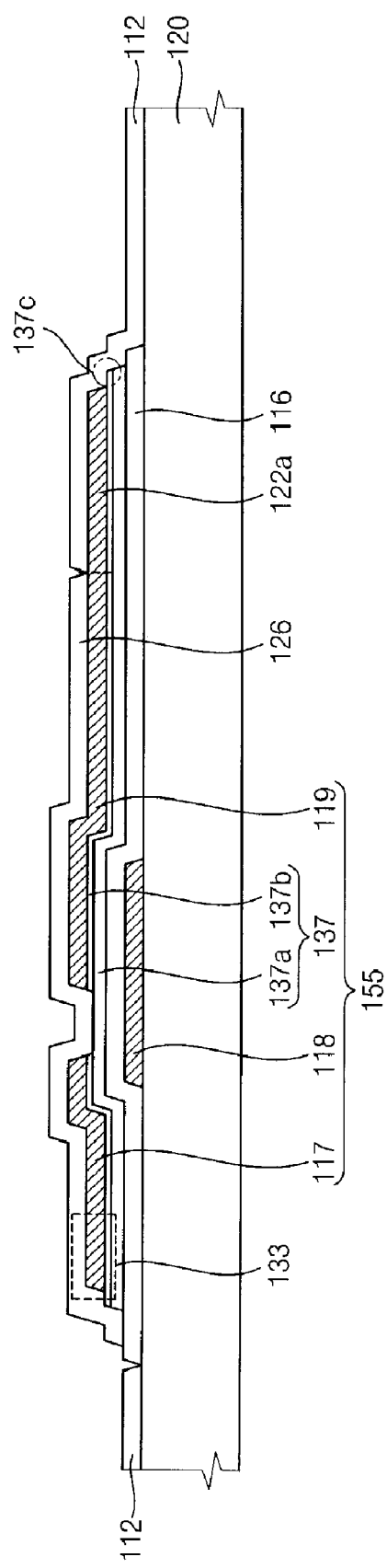
Figure 22:
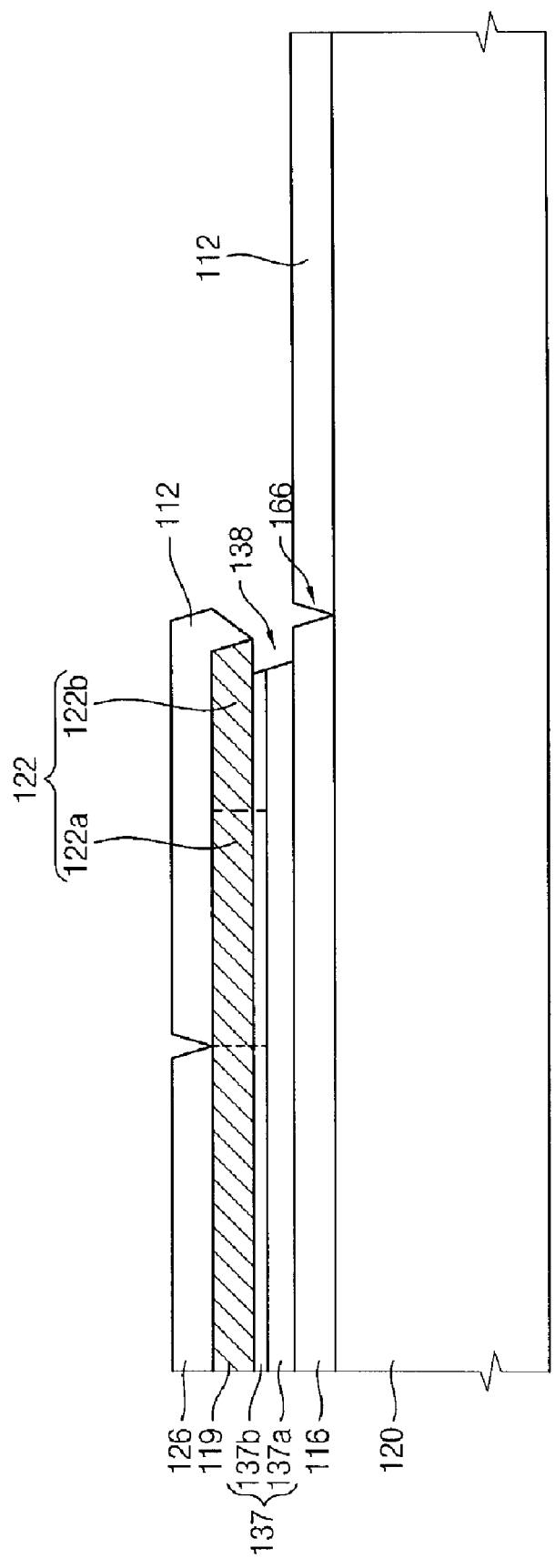

FIG. 21 is a cross-sectional view showing a method of removing the stripping photoresist pattern 157b from the substrate of FIG. 19. FIG. 22 is a cross-sectional view showing the method of removing the stripping photoresist pattern 157b from the substrate of FIG. 20. FIG. 21 corresponds to line I-I' of FIG. 1. FIG. 22 corresponds to line II-II' of FIG. 3.

Referring to FIG. 19, FIG. 20, FIG. 21, and FIG. 22, the stripping photoresist pattern 157b and the stripping pattern 112a are removed using the crack 112b formed between the stripping pattern 112a and the first portion of the pixel electrode 112 on the contact portion 122a.

According to the display substrate and the method of manufacturing the display substrate of FIGS. 1 to 22, a surface of the contact electrode 122 is not decreased to prevent a contact surface between the contact electrode 122 and the pixel electrode 112 from being decreased. Additionally, the contact electrode 122 has a substantially U-shape so that the drain electrode 119 is electrically connected to the pixel electrode 112 in each first opening 166 through the contact portion 122a of the contact electrode 122, even though a crack is formed in the pixel electrode 112 on the undercut portion 122b. Therefore, the contact electrode 122 may make secure contact with the pixel electrode 112 through the contact portion 122a although the contact surface of the contact electrode 122 is not decreased.

In addition, when decreasing the thickness of the second photoresist pattern 157a on the contact electrode 122, the etching process for forming the display substrate having an irregular surface may be uncontrollable. However, in FIGS. 1 to 22, the thickness of the second photoresist pattern 157a on the contact electrode 122 is more than about 11,000 Å, which may protect the semiconductor pattern 137 from the ashing process, thereby preventing an undercut under the contact portion 122a. Thus, yield of the display substrate may be increased.

Furthermore, the display substrate may be manufactured using fewer masks, thereby decreasing manufacturing cost.

Figure 23:
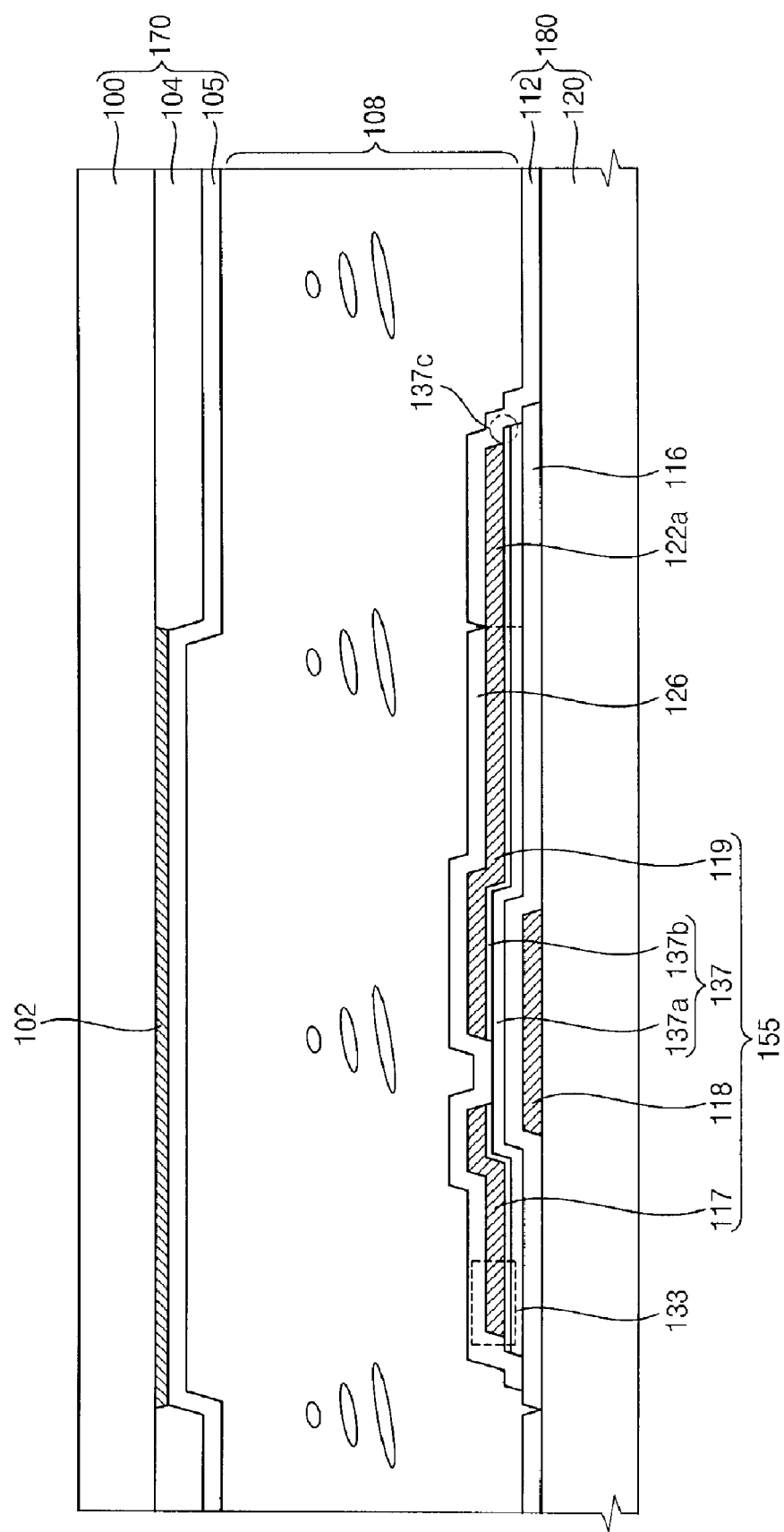
FIG. 23 is a cross-sectional view showing a display device in accordance with an exemplary embodiment of the present invention.

FIG. 23 is a cross-sectional view showing a display device in accordance with an exemplary embodiment of the present invention.

Referring to FIG. 23, the display device includes a display substrate 180, an opposite substrate 170, and a liquid crystal layer 108. The display substrate 180 of FIG. 23 is the same as in FIGS. 1 to 4. Thus, the same reference numerals will be used to refer to the same or like parts as those described in FIGS. 1 to 4 and any further explanation concerning the above elements will be omitted.

The opposite substrate 170 includes an insulating substrate 100, a black matrix 102, a color filter 104, and a common electrode 105.

The insulating substrate 100 includes a transparent insulating material. For example, the insulating substrate 100 may include substantially the same material as the insulating substrate 120 of the display substrate 180.

The black matrix 102 is on the insulating substrate 100 to block light incident into a region in which liquid crystals are uncontrollable. Alternatively, the black matrix 102 may be formed on the display substrate 180.

The color filter 104 is on the insulating substrate 100 having the black matrix 102 to transmit a color of light having a predetermined wavelength. The color filter 104 faces a pixel electrode 112 of the display substrate 180.

The common electrode 105 includes a transparent conductive material. Examples of the transparent conductive material include indium zinc oxide (IZO), indium tin oxide (ITO), indium tin zinc oxide (ITZO), amorphous indium tin oxide (a-ITO), etc.

The display device may further include a spacer (not shown) interposed between the display substrate 180 and the opposite substrate 170. The spacer maintains a distance between the display substrate 180 and the opposite substrate 170.

The liquid crystal layer 108 is interposed between the display substrate 180 and the opposite substrate 170. The liquid crystals of the liquid crystal layer 108 vary their arrangement in response to an electric field formed between the common electrode 105 and the pixel electrode 112, thereby changing light transmittance of the liquid crystal layer 108. Thus, an image having a predetermined gray-scale may be displayed.

The display substrate 180 may further include a sealant (not shown) between the display substrate 180 and the opposite substrate 170 to seal the liquid crystal layer 108.

According to the display device of FIG. 23, defects of the display substrate 180 may be decreased so that the image display quality of the display device may be improved.

Figure 24:
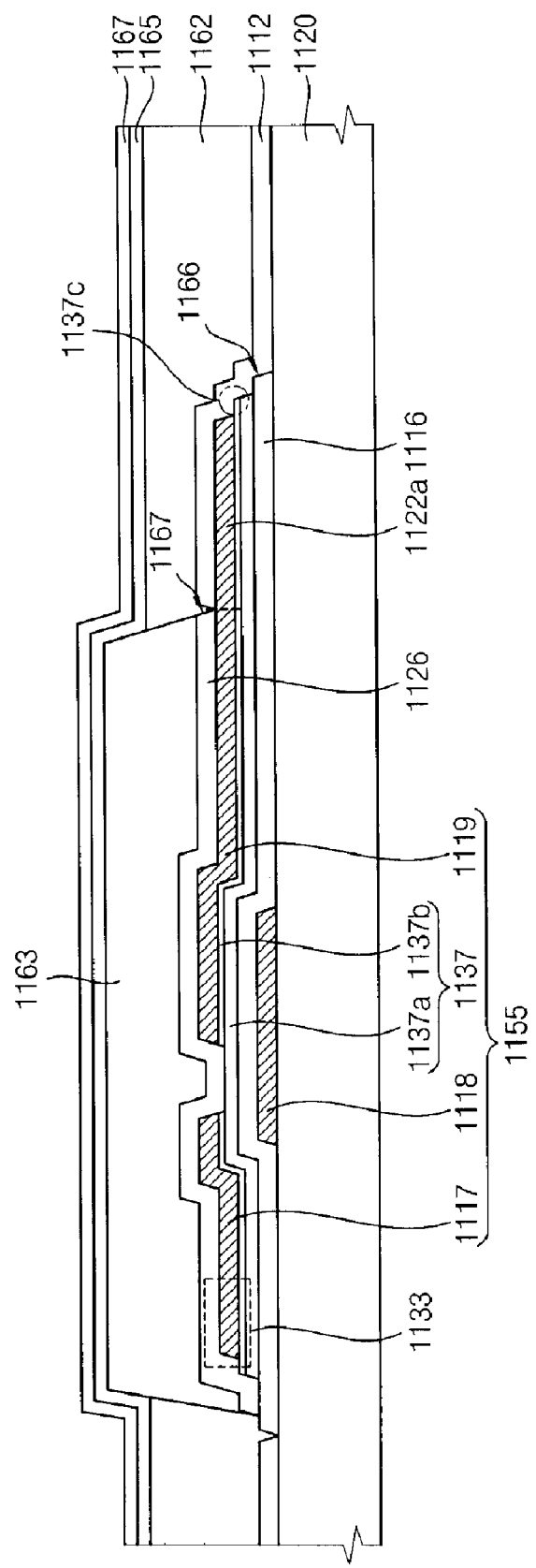
FIG. 24 is a cross-sectional view showing a display device in accordance with another exemplary embodiment of the present invention.

FIG. 24 is a cross-sectional view showing a display device in accordance with another exemplary embodiment of the present invention.

Referring to FIG. 24, the display device includes an insulating substrate 1120, a gate line (not shown), a data line (not shown), a driving voltage line 1133, a driving transistor 1155, a switching transistor (not shown), a gate insulating layer 1116, a passivation layer 1126, a bank 1163, an organic light emitting layer 1162, an opposite electrode 1165, and an overcoat layer 1167. For example, the display device may further include a contact electrode having a contact portion 1122a and an undercut portion (not shown).

The gate line is on the insulating substrate 1120, and it is electrically connected to a gate electrode (not shown) of the switching transistor.

The gate insulating layer 1116 covers the gate line, the gate electrode of the switching transistor, and a gate electrode 1118 of the driving transistor 1155. For example, the gate insulating layer 1116 may include a plurality of openings 1166 arranged in a matrix.

The semiconductor pattern 1137 is on the gate insulating layer 1116 at locations corresponding to the data line, the driving voltage line 1133, source and drain electrodes (not shown) of the switching transistor, source and drain electrodes 1117 and 1119 of the driving transistor 1155, and the contact electrode.

The data line is on the semiconductor pattern 1137, and it crosses the gate line. The data line is electrically connected to the source electrode of the switching transistor.

The drain electrode of the switching transistor is on the semiconductor pattern 1137, and it may be electrically connected to the gate electrode 1118 of the driving transistor 1155 through a contact hole (not shown) formed in the gate insulating layer 1116.

The switching transistor applies a control signal to the gate electrode 1118 of the driving transistor 1155 based on a gate signal and a data signal. The gate signal is transmitted through the gate line, and the data signal is transmitted through the data line.

The driving voltage line 1133 is on the semiconductor pattern 1137, and it is electrically connected to the source electrode 1117 of the driving transistor 1155.

The drain electrode 1119 of the driving transistor 1155 is on the semiconductor pattern 1137, and it is electrically connected to the contact electrode.

The contact electrode is on the semiconductor pattern 1137. The contact portion 1122a is electrically connected to the drain electrode 1119 of the driving transistor 1155. The contact portion 1122a partially exposes an n+ amorphous silicon pattern 1137b of the semiconductor pattern 1137 along protrusion 1137c.

The undercut portion is electrically connected to the contact portion 1122a. The undercut portion covers the semiconductor pattern 1137, and it protrudes from edges of the semiconductor pattern 1137. Thus, an undercut (not shown) is formed under the undercut portion of the contact electrode.

In the display device of FIG. 24, the undercut portion protrudes from opposite corners of the contact portion 1122a to form substantially a U-shape, similar to that shown in FIG. 3.

The passivation layer 1126 covers the semiconductor pattern 1137, the data line, the driving voltage line 1133, the switching transistor, and the driving transistor 1155. The passivation layer 1126 includes a plurality of second openings 1167. The contact electrode and the pixel electrode 1112 are partially exposed through each second opening 1167.

The pixel electrode 1112 is formed in each second opening 1167 of the passivation layer 1126, and it is electrically connected to the contact portion 1122a of the contact electrode. The pixel electrode 1112 includes a transparent conductive material.

The bank 1163 is on the passivation layer 1126, and it defines a light emitting region. For example, the bank 1163 may include an organic insulating material, and the light emitting region corresponds to each second opening 1167.

The organic light emitting layer 1162 is formed in the light emitting region, and it covers the pixel electrode 1112.

The opposite electrode 1165 is formed on the bank 1163 and the organic light emitting layer 1162. For example, the opposite electrode 1165 may include a metallic material.

The overcoat layer 1167 is on the opposite electrode 1165, and it protects the opposite electrode 1165.

When a current flows between the pixel electrode 1112 and the opposite electrode 1165 through the organic light emitting layer 1162, the organic light emitting layer 1162 generates light having a predetermined gray-scale, thereby displaying an image.

According to the display device of FIG. 24, defects of the display device may be decreased, thereby improving image display quality.

Figure 25:
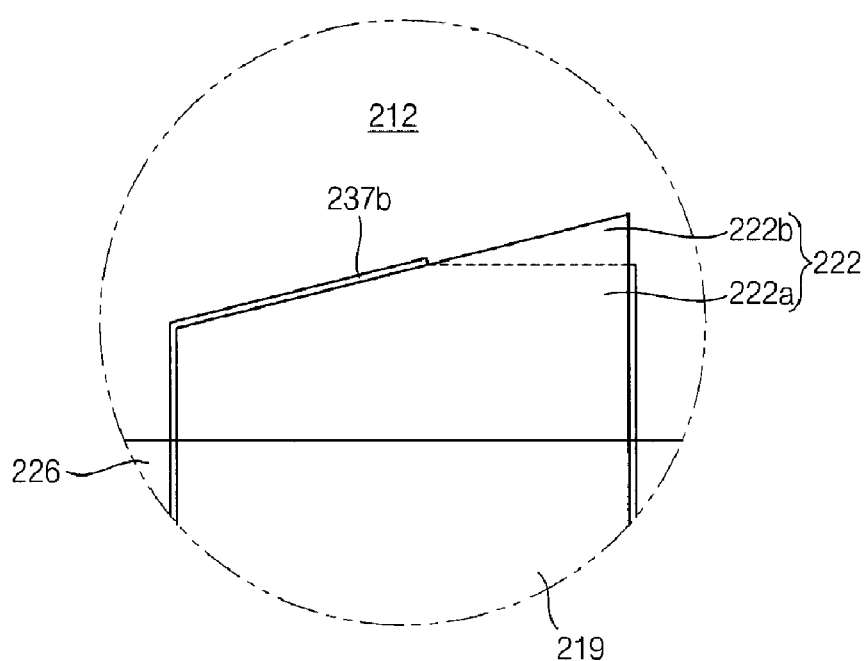
FIG. 25 is a plan view showing a contact electrode in accordance with another exemplary embodiment of the present invention.

FIG. 25 is a plan view showing a contact electrode in accordance with another exemplary embodiment of the present invention. The contact electrode of FIG. 25 is the same as in FIGS. 1 to 4 except the shape of the semiconductor pattern and the contact electrode. Thus, the same reference numerals will be used to refer to the same or like parts as those described in FIGS. 1 to 4 and any further explanation concerning the above elements will be omitted.

Referring to FIG. 25, a semiconductor pattern including an amorphous silicon pattern and an n+ amorphous silicon pattern 237b is formed on a gate insulating layer 116 (shown in FIG. 2).

The contact electrode 222 includes a contact portion 222a and an undercut portion 222b. The contact portion 222a is formed on the n+ amorphous silicon pattern 237b, and it is electrically connected to a drain electrode 219. The undercut portion 222b is electrically connected to the contact portion 222a.

In FIG. 25, an upper edge of the contact electrode 222 is inclined with respect to a side edge of the contact electrode 222. For example, the upper edge forms an angle of about 5 degrees to about 60 degrees with respect to the side edge of the contact electrode 222. Thus, a first semiconductor portion of the semiconductor pattern under the contact portion 222a is etched smaller than a second semiconductor portion of the semiconductor pattern under the undercut portion 222b by a first translucent portion 159c (shown in FIG. 13) and a second translucent portion 159d (shown in FIG. 13) so that the n+ amorphous silicon pattern 237b protrudes from a side of the contact portion 222a. For example, an interface between the first and second translucent portions 159c and 159d crosses an interface between the contact portion 222a and the undercut portion 222b.

A passivation layer 226 covers the drain electrode 219, and includes an opening partially exposing the contact electrode 222 and a pixel electrode 212.

The pixel electrode 212 is electrically connected to the contact portion 222a of the contact electrode 222 along the protruded n+ amorphous silicon pattern 237b.

According to the contact electrode of FIG. 25, the upper edge is inclined with respect to the side edge of the contact electrode 222 so that the contact electrode 222 may make secure contact with the pixel electrode 212 through the contact portion 222a although a contact area between the contact electrode 222 and the pixel electrode 212 is not decreased.

Figure 26:
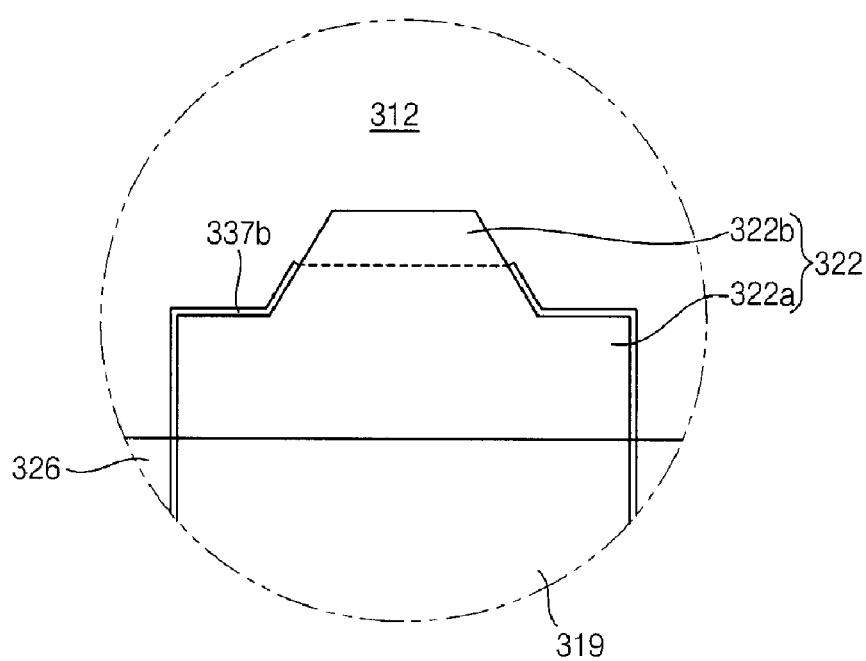
FIG. 26 is a plan view showing a contact electrode in accordance with another exemplary embodiment of the present invention.

FIG. 26 is a plan view showing a contact electrode in accordance with another exemplary embodiment of the present invention. The contact electrode of FIG. 26 is the same as in FIGS. 1 to 4 except the shape of the semiconductor pattern and the contact electrode. Thus, the same reference numerals will be used to refer to the same or like parts as those described in FIGS. 1 to 4 and any further explanation concerning the above elements will be omitted.

Referring to FIG. 26, a semiconductor pattern including an amorphous silicon pattern and an n+ amorphous silicon pattern 337b is formed on a gate insulating layer 116 (shown in FIG. 2).

The contact electrode 322 includes a contact portion 322a and an undercut portion 322b. The contact portion 322a is electrically connected to a drain electrode 319.

In FIG. 26, the undercut portion 322b protrudes along a central line of the contact portion 322a. An interface between a first translucent portion 159c (shown in FIG. 13) and a second translucent portion 159d (shown in FIG. 13) overlaps with an interface between the contact portion 322a and the undercut portion 322b.

A passivation layer 326 covers the drain electrode 319, and it includes an opening partially exposing the contact electrode 322 and a pixel electrode 312.

The pixel electrode 312 is electrically connected to the contact portion 322a of the contact electrode 322 along the protruded n+ amorphous silicon pattern 337b. The protruded n+ amorphous silicon pattern 337b may be formed using the mask shown in FIG. 13.

According to the contact electrode of FIG. 26, the contact electrode 322 has an Ω-shape so that the contact electrode 322 may make secure contact with the pixel electrode 312 through the contact portion 322a although a contact area between the contact electrode 322 and the pixel electrode 312 is not decreased.

Figure 27:
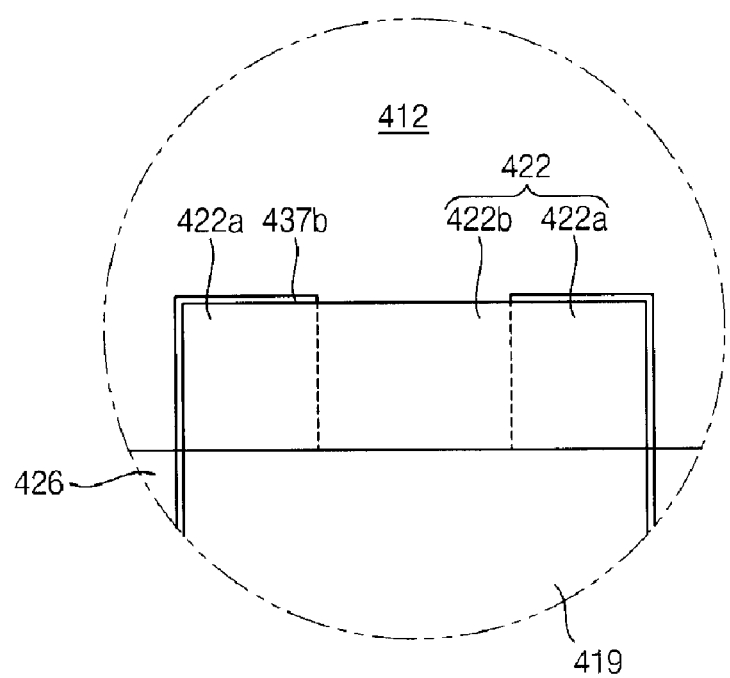
FIG. 27 is a plan view showing a contact electrode in accordance with another exemplary embodiment of the present invention.
Figure 28:
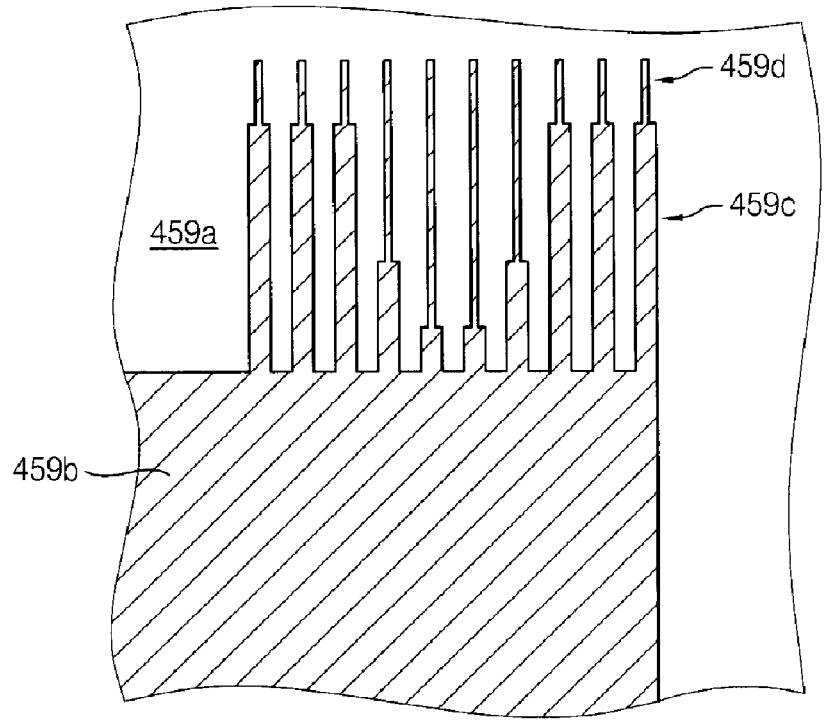
FIG. 28 is a plan view showing a mask for forming a semiconductor pattern of FIG. 27.

FIG. 27 is a plan view showing a contact electrode in accordance with another is exemplary embodiment of the present invention. FIG. 28 is a plan view showing a mask for forming a semiconductor pattern of FIG. 27. The contact electrode and the mask of FIG. 27 and FIG. 28 are the same as in FIGS. 1 to 4 and FIG. 13, respectively, except for the shape of the semiconductor pattern, the contact electrode, and the mask. Thus, the same reference numerals will be used to refer to the same or like parts as those described in FIGS. 1 to 4 and any further explanation concerning the above elements will be omitted.

Referring to FIG. 27, the semiconductor pattern including an amorphous silicon pattern and an n+ amorphous silicon pattern 437b is formed on a gate insulating layer 116 (shown in FIG. 2).

The contact electrode 422 includes a contact portion 422a and an undercut portion 422b. The contact portion 422a is electrically connected to the drain electrode 419. For example, an upper edge of the contact electrode 422 is substantially perpendicular to a side edge of the contact electrode 422.

In FIG. 27, the contact portion 422a includes two parts that are spaced apart from each other, and the undercut portion 422b is interposed between the two parts of the contact portion 422a.

A passivation layer 426 covers the drain electrode 419, and it has an opening through which the contact electrode 422 and a pixel electrode 412 are partially exposed.

The pixel electrode 412 is electrically connected to the contact portion 422a of the contact electrode 422 along the n+ amorphous silicon pattern 437b that protrudes from under the contact portion 422a.

The protruded n+ amorphous silicon pattern 437b of FIG. 27 may be formed using the mask of FIG. 28.

Referring to FIG. 28, the mask includes a transparent portion 459a, an opaque portion 459b, a first translucent portion 459c, and a second translucent portion 459d.

The first translucent portion 459c covers the contact portion 422a, and the second translucent portion 459d covers an upper edge of the undercut portion 422b.

For example, an interface between the first translucent portion 459c and the second translucent portion 459d forms substantially a U-shape, and it may be overlapped with an interface between the contact portion 422a and undercut portion 422b.

According to the contact electrode and mask of FIG. 27 and FIG. 28, the upper edge of the contact electrode 422 has a linear shape substantially perpendicular to the side edge of the contact electrode 422, and the interface between the first translucent portion 459c and the second translucent portion 459d of the mask substantially has a U-shape. Thus, the contact electrode 422 may make secure contact with the pixel electrode 412 through the contact portion 422a although a contact area between the contact electrode 422 and the pixel electrode 412 is not decreased.

Figure 29:
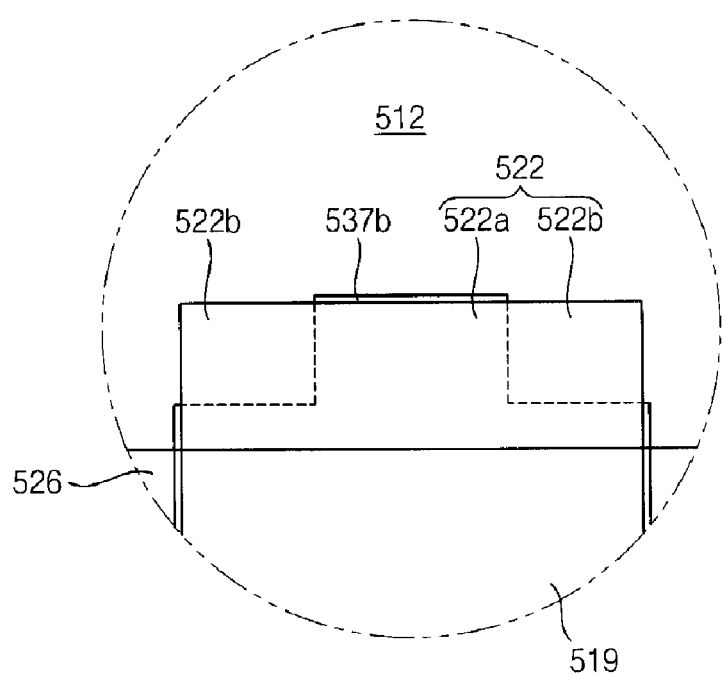
FIG. 29 is a plan view showing a contact electrode in accordance with another exemplary embodiment of the present invention.
Figure 30:
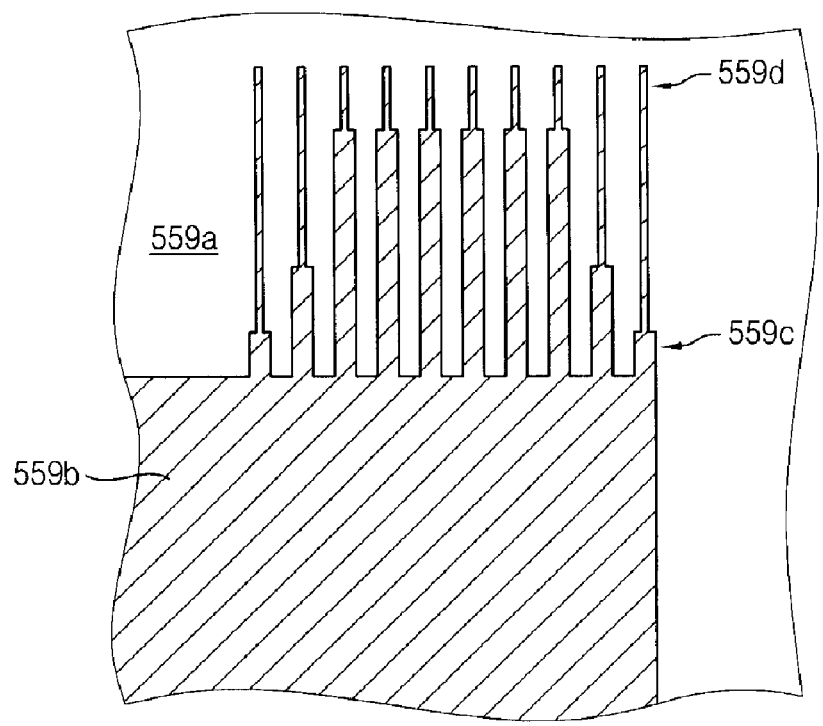
FIG. 30 is a plan view showing a mask for forming a semiconductor pattern of FIG. 29.

FIG. 29 is a plan view showing a contact electrode in accordance with another exemplary embodiment of the present invention. FIG. 30 is a plan view showing a mask for forming a semiconductor pattern of FIG. 29. The contact electrode and the mask of FIG. 29 and FIG. 30 are the same as in FIG. 27 and FIG. 28, respectively, except for the shape of the semiconductor pattern, the contact electrode, and the mask. Thus, the same reference numerals will be used to refer to the same or like parts as those described in FIG. 27 and FIG. 28 and any further explanation concerning the above elements will be omitted.

Referring to FIG. 29, the semiconductor pattern including an amorphous silicon pattern and an n+ amorphous silicon pattern 537b is formed on a gate insulating layer 116 (shown in FIG. 2).

The contact electrode 522 includes a contact portion 522a and an undercut portion 522b. The contact portion 522a is electrically connected to the drain electrode 519. For example, an upper edge of the contact electrode 522 is substantially perpendicular to a side edge of the contact electrode 522.

In FIG. 29, the undercut portion 522b includes two parts that are spaced apart from each other, and the contact portion 522a is interposed between the two parts of the undercut portion 522b.

A passivation layer 526 covers the drain electrode 519, and it has an opening through which the contact electrode 522 and a pixel electrode 512 are partially exposed.

The pixel electrode 512 is electrically connected to the contact portion 522a of the contact electrode 522 along the n+ amorphous silicon pattern 537b that protrudes from under the contact portion 522a.

The protruded n+ amorphous silicon pattern 537b of FIG. 29 may be formed using the mask of FIG. 30.

For example, an interface between the first translucent portion 559c and the second translucent portion 559d forms substantially a Ω-shape, and it may overlap with an interface between the contact portion 522a and the undercut portion 522b.

According to the contact electrode and the mask of FIG. 29 and FIG. 30, the interface between the first translucent portion 559c and the second translucent portion 559d of the mask has substantially a Ω-shape so that the contact electrode 522 may make secure contact with the pixel electrode 512 through the contact portion 522a although a contact area between the contact electrode 522 and the pixel electrode 512 is not decreased.

Figure 31:
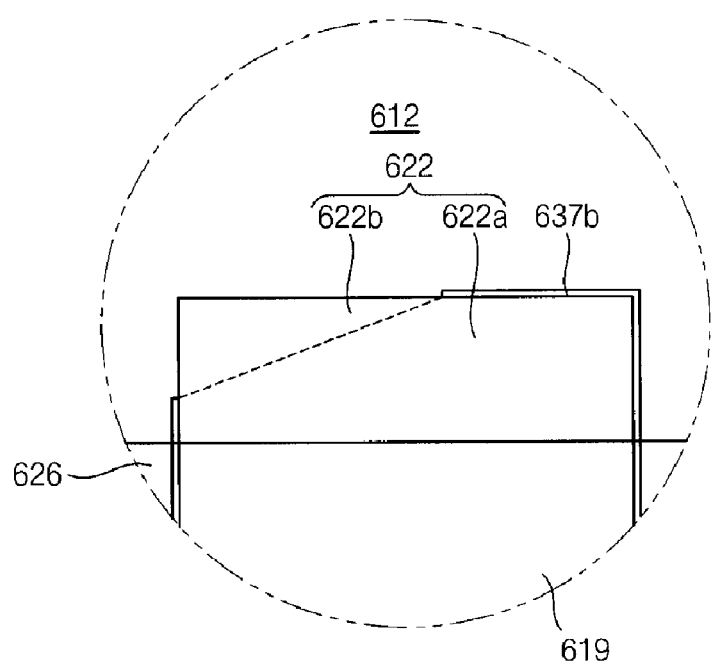
FIG. 31 is a plan view showing a contact electrode in accordance with another exemplary embodiment of the present invention.
Figure 32:
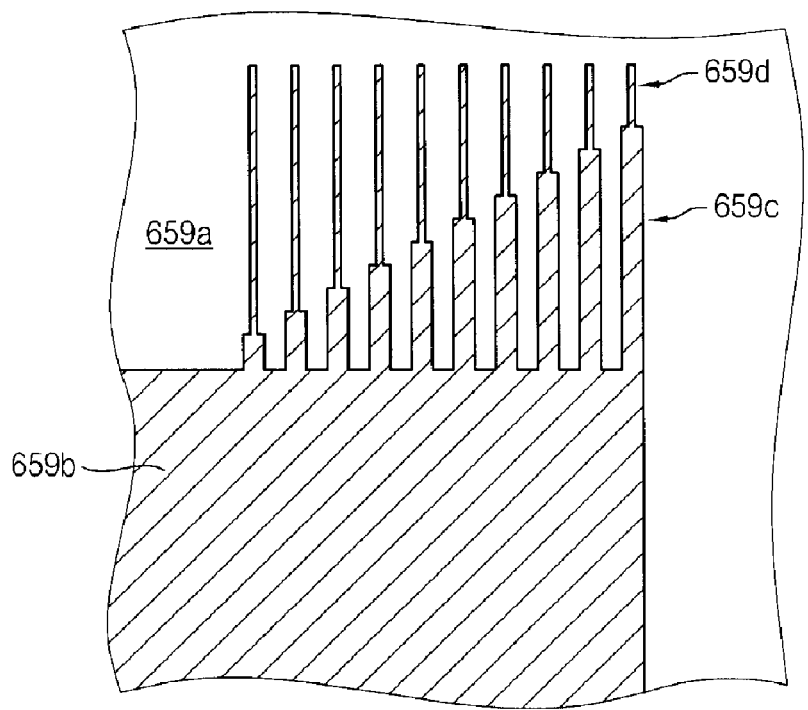
FIG. 32 is a plan view showing a mask for forming a semiconductor pattern of is FIG. 31.

FIG. 31 is a plan view showing a contact electrode in accordance with another exemplary embodiment of the present invention. FIG. 32 is a plan view showing a mask for forming a semiconductor pattern of FIG. 31. The contact electrode and the mask of FIG. 31 and FIG. 32 are same as in FIG. 29 and FIG. 30, respectively, except for the shape of the semiconductor pattern, the contact electrode, and the mask. Thus, the same reference numerals will be used to refer to the same or like parts as those described in FIG. 29 and FIG. 30 and any further explanation concerning the above elements will be omitted.

Referring to FIG. 31, the semiconductor pattern including an amorphous silicon pattern and an n+ amorphous silicon pattern 637b is formed on a gate insulating layer 116 (shown in FIG. 2).

The contact electrode 622 includes a contact portion 622a and an undercut portion 622b. The contact portion 622a is electrically connected to the drain electrode 619. For example, an upper edge of the contact electrode 622 is substantially perpendicular to a side edge of the contact electrode 622.

In FIG. 31, the undercut portion 622b is at a first corner of the contact electrode 622, and the contact portion 622a is at a second corner of the contact electrode 622.

A passivation layer 626 covers the drain electrode 619, and it has an opening through which the contact electrode 622 and a pixel electrode 612 are partially exposed.

The pixel electrode 612 is electrically connected to the contact portion 622a of the contact electrode 622 along the n+ amorphous silicon pattern 637b that protrudes from under the contact portion 622a.

The protruded n+ amorphous silicon pattern 637b of FIG. 31 may be formed using the mask of FIG. 32.

An interface between a first translucent portion 659c and a second translucent portion 659d of the mask is inclined with respect to a longitudinal direction of slits of the first and second translucent portions 659c and 659d. For example, the interface between the first and second translucent portions 659c and 659d may form an angle of about 5 degrees to about 60 degrees with respect to the longitudinal direction of the slits of the first and second translucent portions 659c and 659d. Additionally, the interface between the first and second translucent portions 659c and 659d may overlap with an interface between the contact portion 622a and the undercut portion 622b.

According to the contact electrode and the mask of FIG. 31 and FIG. 32, the interface between the first translucent portion 659c and the second translucent portion 659d of the mask is inclined with the respect to the longitudinal direction of the slits so that the contact electrode 622 may make secure contact with the pixel electrode 612 through the contact portion 622a although a contact area between the contact electrode 622 and the pixel electrode 612 is not decreased.

As described above, the second photoresist film includes positive photoresist. Alternatively, the second photoresist film may include negative photoresist, and patterns of the second mask may be reversed.

According to exemplary embodiments of the present invention, the contact electrode or the mask for exposing the second photoresist pattern have various shapes so that the contact electrode may have various shapes although the area of the contact electrode is not decreased. Additionally, the drain electrode is electrically connected to the pixel electrode in each first opening through the contact portion although the crack is formed in the pixel electrode. Thus, the contact electrode may make secure contact with the pixel electrode through the contact portion although the contact area of the contact electrode is not decreased.

In addition, when the thickness of the second photoresist pattern on the contact electrode is decreased, the thickness of the second photoresist pattern may be uncontrollable and irregularly developed. However, in the present invention, the second photoresist pattern on the contact electrode is more than about 11,000 Å thick so that the second photoresist pattern protects the semiconductor pattern from the first etching process and the ashing process, thereby preventing the undercut under the contact portion. Thus, yield of the display substrate may be increased.

Furthermore, the number of the masks for manufacturing the display substrate may be decreased so that manufacturing cost of the display substrate and the display device having the display substrate may be decreased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display substrate, comprising:
   an insulating substrate;
   a thin film transistor arranged on the insulating substrate, the thin film transistor comprising a control electrode, a semiconductor pattern, a first electrode, and a second electrode spaced apart from the first electrode;
   a contact electrode, the contact electrode comprising:
      a first end opposite the first electrode and electrically connected to the second electrode, and
      a second end comprising:
         a contact portion electrically connected to the second electrode, the contact portion exposing a portion of the semiconductor pattern; and an undercut portion electrically connected to the contact portion, the undercut portion extending beyond an edge of the semiconductor pattern; and a pixel electrode electrically connected to the contact portion of the contact electrode, wherein the control electrode is arranged on the insulating substrate, the semiconductor pattern is arranged on the control electrode, and the first electrode and the second electrode are arranged on the semiconductor pattern, wherein an edge of the contact portion and an edge of the undercut portion form a substantially straight line that forms an angle of about 5 degrees to about 60 degrees with respect to an interface between the second electrode and the contact electrode.

2. The display substrate of claim 1, wherein the contact portion is recessed with respect to the undercut portion.

3. The display substrate of claim 1, wherein an upper edge of the contact electrode is substantially parallel with an interface between the second electrode and the contact electrode.

4. The display substrate of claim 1, further comprising a passivation layer interposed between the pixel electrode and an adjacent pixel electrode, the passivation layer covering the thin film transistor.

5. The display substrate of claim 1, wherein the semiconductor pattern protrudes from under the contact portion, and the pixel electrode extends from the contact electrode toward the insulating substrate along the protruded semiconductor pattern.

6. The display substrate of claim 1, further comprising:
an organic light emitting layer on the pixel electrode; and
an opposite electrode on the organic light emitting layer.

7. The display substrate of claim 1, wherein the contact electrode is integrally formed with the second electrode.

8. A liquid crystal display device, comprising:
a display substrate, the display substrate comprising:
an insulating substrate;
a thin film transistor comprising a control electrode on the insulating substrate, a semiconductor pattern on the control electrode, a first electrode on the semiconductor pattern, and a second electrode on the semiconductor pattern and spaced apart from the first electrode;
a contact electrode comprising:
a first end opposite the first electrode and electrically connected to the second electrode, and
a second end comprising:
a contact portion electrically connected to the second electrode and exposing a portion of the semiconductor pattern; and
an undercut portion electrically connected to the contact portion extending beyond an edge of the semiconductor pattern;
a pixel electrode electrically connected to the contact portion of the contact electrode;
an opposite substrate, the opposite substrate comprising:
an insulating substrate, and
a common electrode on the insulating substrate and arranged corresponding to the pixel electrode; and
a liquid crystal layer interposed between the display substrate and the opposite substrate, wherein the control electrode is arranged on the insulating substrate, the semiconductor pattern is arranged on the control electrode, and the first electrode and the second electrode are arranged on the semiconductor pattern, wherein the semiconductor pattern protrudes from under the contact portion, and the pixel electrode extends from the contact electrode toward the insulating substrate along the protruded semiconductor pattern.

9. A display substrate, comprising:
an insulating substrate;
a thin film transistor arranged on the insulating substrate, the thin film transistor comprising a control electrode, a semiconductor pattern, a first electrode, and a second electrode spaced apart from the first electrode;
a contact electrode, the contact electrode comprising:
a first end opposite the first electrode and electrically connected to the second electrode, and
a second end comprising:
a contact portion electrically connected to the second electrode, the contact portion exposing a portion of the semiconductor pattern; and
an undercut portion electrically connected to the contact portion, the undercut portion extending beyond an edge of the semiconductor pattern; and
a pixel electrode electrically connected to the contact portion of the contact electrode, wherein the control electrode is arranged on the insulating substrate, the semiconductor pattern is arranged on the control electrode, and the first electrode and the second electrode are arranged on the semiconductor pattern, wherein the semiconductor pattern protrudes from under the contact portion, and the pixel electrode extends from the contact electrode toward the insulating substrate along the protruded semiconductor pattern.

10. The display substrate of claim 9, wherein the contact portion is recessed with respect to the undercut portion.

11. The display substrate of claim 9, wherein an edge of the contact portion and an edge of the undercut portion form a substantially straight line that forms an angle of about 5 degrees to about 60 degrees with respect to an interface between the second electrode and the contact electrode.

12. The display substrate of claim 9, wherein an upper edge of the contact electrode is substantially parallel with an interface between the second electrode and the contact electrode.

13. The display substrate of claim 9, further comprising a passivation layer interposed between the pixel electrode and an adjacent pixel electrode, the passivation layer covering the thin film transistor.

14. The display substrate of claim 9, further comprising:
an organic light emitting layer on the pixel electrode; and
an opposite electrode on the organic light emitting layer.

15. The display substrate of claim 9, wherein the contact electrode is integrally formed with the second electrode.

* * * * *